US012765263B2

(12) United States Patent
Zamprogno et al.

(10) Patent No.: US 12,765,263 B2
(45) Date of Patent: Oct. 13, 2026

(54) ENERGY RECOVERY DRIVER FOR PZT ACTUATORS

(71) Applicants: STMicroelectronics S.r.l., Agrate Brianza (IT); Politecnico Di Milano, Milan (IT)

(72) Inventors: Marco Zamprogno, Cesano Maderno (IT); Raffaele Enrico Furceri, Legnano (IT); Matteo Gianollo, Monza (IT); Giacomo Langfelder, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 655 days.

(21) Appl. No.: 18/222,180

(22) Filed: Jul. 14, 2023

(65) Prior Publication Data

US 2024/0049604 A1 Feb. 8, 2024

Related U.S. Application Data

(63) Continuation-in-part of application No. 17/879,066, filed on Aug. 2, 2022, now Pat. No. 12,520,728.

(51) Int. Cl.
*H10N 30/80* (2023.01)
*H02J 7/00* (2006.01)
(Continued)

(52) U.S. Cl.
CPC ........... *H10N 30/802* (2023.02); *H02J 7/865* (2026.01); *H02M 3/158* (2013.01); *H02N 2/06* (2013.01)

(58) Field of Classification Search
CPC ......... H10N 30/802; H02N 2/06; H02J 7/865; H02M 3/158
See application file for complete search history.

(56) References Cited

U.S. PATENT DOCUMENTS 5,691,592 A 11/1997 Gunderson et al.
6,081,061 A 6/2000 Reineke et al.
(Continued)

FOREIGN PATENT DOCUMENTS

CN 112953218 A 6/2021
DE 102013219609 A1 4/2015
(Continued)

OTHER PUBLICATIONS

Chen, Zhenwei et al: "Design and Experimental Analysis of Charge Recovery for Piezoelectric Fan," Actuators 2022, 11, 20, https://doi.org/10.3390/act11010020, 18 pgs.
(Continued)

*Primary Examiner* — Emily P Pham
(74) *Attorney, Agent, or Firm* — Crowe & Dunlevy LLC

(57) ABSTRACT

A differential piezoelectric actuator-system includes an inductor and driver-circuit having switches for transferring energy between first and second actuators and the inductor, and between a voltage-supply node and the inductor. Control circuitry determines whether a next phase in which to operate the driver-circuit is a first charging-phase or a first recovery-phase. The first charging-phase includes operating the switches in: a first sub-phase to transfer energy from the first actuator to the inductor; a second sub-phase to transfer energy from the voltage supply node to the inductor; and a third sub-phase to transfer energy from the inductor to the second actuator. The first recovery-phase includes operating the switches in: a first sub-phase to transfer energy from the first actuator to the inductor; a second sub-phase to transfer energy from the inductor to the voltage supply node; and a third sub-phase to transfer energy from the inductor to the second actuator.

25 Claims, 13 Drawing Sheets

(51) Int. Cl.
*H02M 3/158* (2006.01)
*H02N 2/06* (2006.01)

(56) References Cited

U.S. PATENT DOCUMENTS

| | | | | |
|---|---|---|---|---|
| 7,391,190 | B1 * | 6/2008 | Rajagopalan ....... | H02M 3/1582 323/283 |
| 10,931,199 | B2 | 2/2021 | Chaput et al. | |
| 11,374,496 | B2 | 6/2022 | Chaput et al. | |
| 11,757,360 | B1 * | 9/2023 | Liang ....................... | H04R 3/06 381/96 |
| 2024/0049604 | A1 | 2/2024 | Zamprogno et al. | |
| 2025/0247020 | A1 | 7/2025 | Zamprogno et al. | |

FOREIGN PATENT DOCUMENTS

| | | | |
|---|---|---|---|
| DE | 102017207821 | A1 | 11/2018 |
| EP | 1420466 | A2 | 10/2003 |
| EP | 2804229 | B1 | 7/2016 |

OTHER PUBLICATIONS

Ozaki, Takashi et al: "Power-Efficient Driver Circuit for Piezo Electric Actuator with Passive Charge Recovery," Energies 2020, 13, 2866; doi:10.3390/en13112866, Apr. 2020, 15 pgs.

EP Search Report and Written Opinion for counterpart EP Appl. No. 23188320.8, report dated Jan. 23, 2024, 5 pgs.

* cited by examiner

Charging Phase C12

| Current State | Error | Reference Sign | Reference Slope Sign | Next State |
|---|---|---|---|---|
| R21 | Negative | Negative | | C21 |
| | Positive | | Positive | C12 |
| C21 | Positive | | Positive | R12 |
| R12 | Negative | | Negative | C21 |
| | Positive | Positive | | C12 |
| C12 | Negative | | Negative | R21 |

FIG. 7

ENERGY RECOVERY DRIVER FOR PZT ACTUATORS

RELATED APPLICATION

This is a continuation-in-part of U.S. patent application Ser. No. 17/879,066, filed on Aug. 2, 2022, the contents of which are incorporated by reference in their entirety.

TECHNICAL FIELD

This disclosure is related to the field of energy recovery drivers for piezoelectric actuators.

BACKGROUND

Piezoelectric actuators are small devices, constructed for example from lead zirconate titanate, that produce a small displacement with a relatively high force capability when a voltage is applied. There are many applications where a piezoelectric actuator may be used, such as in speakers and linearly driven micromirrors. Such piezoelectric actuators are driven with low to medium frequency signals (e.g., up to 20 kHz) having a full-scale voltage range of up to 50V or more.

Piezoelectric actuators can be designed such that they are differentially driven and may be modeled as dual capacitive loads having capacitance values on the order of tens of nF. In order to achieve desired performance characteristics, piezoelectric actuator designs increasingly have higher capacitances, leading to stability/bandwidth issues when driven by conventional drivers.

Now described with reference to FIG. 1 is a conventional fully-differential linear driver 1 for a piezoelectric actuator that attempts to address the issues described above. The driver 1 includes a sigma-delta modulated digital to analog converter (DAC) 2 that receives data DAC_DATA as an input, is clocked by a clock DAC_CLK, and provides an analog version of the data DAC_DATA to a transimpedance amplifier (TIA) 3. The output of the TIA 3 is first amplified by a low-voltage driver (LVD) 4, and is then further amplified by a high-voltage driver (HVD) 5. The output of the HVD 5 is differential (two signals that change symmetrically about a common mode), continuous, and fed to the components of the piezoelectric actuator represented as the capacitors PZT1, PZT2 to thereby drive the piezoelectric actuator as desired. Notice that the HVD 5 is powered by a high voltage VHV (on the order of tens of volts) that is generated by a boost converter 6 external to the driver 1.

This design, however, suffers from several limitations. For example, power consumption is undesirably high. The use of multiple amplifiers 3, 4, and 5 that each consume a non-negligible amount of power, together with noise and linearity requirements, causes this high power consumption. In addition, since the HVD 5 is biased by the VHV voltage, and the quiescent current of the HVD 5 is non-negligible, further contributing to the high power consumption—worse, the higher the voltage VHV for a given quiescent current, the higher the contribution to the power consumption by the HVD 5. Still further, since no energy recovery is performed, the capacitors PZT1, PZT2 contribute to power consumption, as the charge on the capacitors is lost when they are discharged to ground during operation. Moreover, since the power consumption by the capacitors PZT1, PZT2 can be described as a $C \cdot V^2 \cdot f$ term (with C being the capacitance of PZT1, PZT2, V being the voltage of the driving signal applied thereto, f being the frequency of the driving signal applied thereto) and since each value of this term has been increasing with recent designs, conventional designs which discharge the capacitances to ground are increasingly undesirable.

On top of power consumption concerns, conventional driver designs suffer from additional drawbacks. For example, the value of the capacitances PZT1, PZT2 are increasing in current designs as stated, having the effect of increasing the difficulty of stabilizing the HVD 5 and increasing the current consumption of the HVD 5.

Still further, noise and THD (total harmonic distortion) performance is of concern. The resolution of the output differential signal used to drive the piezoelectric actuator represented by the capacitances PZT1, PZT2 is to be relatively high, for example 16-bit, and therefore the noise and linearity of the output differential signal is to be compatible with this resolution, leading to increased power consumption by the amplifiers 3, 4, and 5 when they are so-designed, leading also to increased area. Since the signal to be managed by the amplifiers 3, 4, and 5 is of low to medium frequency, the low frequency noise is to be carefully managed. To carefully manage this term with conventional designs, complex designs for the amplifiers 3, 4, and 5 are utilized.

In addition, there are technological issues with conventional designs. The designs of the amplifiers 3, 4, and 5 may utilize components such as high resistance resistors and high voltage capacitors. High resistance resistors (on the order of megaohms) that might be used suffer from excess area consumption, lack of linearity, contribute to power consumption, and may include undesirable parasitics. High voltage capacitors often have poor yield, increasing production costs.

In view of this panoply of drawbacks with conventional driver designs, further development is needed.

SUMMARY

Disclosed herein is a driver system for a differential piezoelectric actuator system. The driver system includes an inductor, and a driver circuit with switches for selectively facilitating transfer of energy between first and second actuators of the differential piezoelectric actuator system and the inductor and between a voltage supply node and the inductor. Control circuitry is present and configured to determine whether a next phase in which to operate the driver circuit is a first charging phase or a first recovery phase, based upon feedback signals.

In a first sub-phase of the first charging phase, the control circuitry operates the switches to transfer energy from the first actuator to the inductor, in a second sub-phase of the first charging phase, the control circuitry operates the switches to transfer energy from the voltage supply node to the inductor, and in a third sub-phase of the first charging phase, the control circuitry operates the switches to transfer energy from the inductor to the second actuator.

In a first sub-phase of the first recovery phase, the control circuitry operates the switches to transfer energy from the first actuator to the inductor, in a second sub-phase of the first recovery phase, the control circuitry operates the switches to transfer energy from the inductor to the voltage supply node, and in a third sub-phase of the first recovery phase, the control circuitry operates the switches to transfer energy from the inductor to the second actuator.

The control circuitry may be further configured to, in a fourth sub-phase of the first charging phase, operate the switches to maintain an inductor current through the inductor as being fixed, ready for a next phase in which the inductor current may be reversed.

The control circuitry may be further configured to, in a fourth sub-phase of the first recovery phase, operate the switches to maintain an inductor current through the inductor as being fixed, ready for a next phase in which the inductor current may be reversed.

The duration of the first sub-phase of the first charging phase may be set by the control circuitry based upon the feedback signals from the previous phase, a reference differential voltage, and a reference common mode voltage. A duration of the second sub-phase of the first charging phase may be set by the control circuitry based upon the feedback signals from the previous phase, the reference differential voltage, and the reference common mode voltage. A duration of the third sub-phase of the first charging phase may be set by the control circuitry based upon a zero crossing of an instantaneous value of an inductor current through the inductor. The feedback signals may be a differential between the voltages across the first and second actuators, a common mode of the voltages across the first and second actuators, and a continuous time value of the inductor current.

A duration of the first sub-phase of the first recovery phase may be set by the control circuitry based upon the feedback signals from the previous phase, a reference differential voltage, and a reference common mode voltage. A duration of the second sub-phase of the first recovery phase may be set by the control circuitry based upon the feedback signals from the previous phase, the reference differential voltage, and the reference common mode voltage. A duration of the third sub-phase of the first recovery phase may be set by the control circuitry based upon a zero crossing of the instantaneous value of the inductor current. The feedback signals may be a differential between the voltages across the first and second actuators, a common mode of the voltages across the first and second actuators, and a continuous time value of the inductor current.

The driver circuit may also include additional switches for selectively operating the driver circuit, under control of the control circuitry, as a boost converter to generate a high voltage for driving some of the switches, the high voltage being greater than a voltage at the voltage supply node.

The control circuitry may be further configured to whether the next phase in which to operate the driver circuit is a second charging phase or a second recovery phase, based upon the feedback signals.

The control circuitry may be further configured to, in a first sub-phase of the second charging phase, operate the switches to transfer energy from the second actuator to the inductor, in a second sub-phase of the second charging phase, operate the switches to transfer energy from the voltage supply node to the inductor, and in a third sub-phase of the second charging phase, operate the switches to transfer energy from the inductor to the first actuator.

The control circuitry may be further configured to, in a first sub-phase of the second recovery phase, operate the switches to transfer energy from the second actuator to the inductor, in a second sub-phase of the second recovery phase, operate the switches to transfer energy from the inductor to the voltage supply node, and in a third sub-phase of the second recovery phase, operate the switches to transfer energy from the inductor to the first actuator. The feedback signals may be a differential between the voltages across the first and second actuators, a common mode of the voltages across the first and second actuators, and a continuous time value of the inductor current.

The control circuitry may determine whether the next phase in which to operate the driver circuit is the first charging phase, the first recovery phase, the second charging phase, or the second recovery phase based upon the feedback signals by: a) determining an error value to be a difference between the differential between the voltages across the first and second actuators and a reference differential voltage; b) determining a reference sign to be a sign of a current value of a reference differential voltage; c) determining a reference slope sign to be a sign of a current slope of the reference differential voltage; d) determining a residual energy within the inductor; e) if a current phase in which the control circuitry is operating the driver circuit is the second recovery phase and error value and reference sign are both negative, determining the next phase to be the second charging phase; f) if the current phase in which the control circuitry is operating the driver circuit is the second recovery phase and error value and reference slope sign are both positive, determining the next phase to be the first charging phase; g) if the current phase in which the control circuitry is operating the driver circuit is the second charging phase and error value and reference slope sign are both positive, determining the next phase to be the first recovery phase; h) if the current phase in which the control circuitry is operating the driver circuit is the first recovery phase and error value and reference slope sign are both negative, determining the next phase to be the second charging phase; i) if the current phase in which the control circuitry is operating the driver circuit is the first recovery phase and error value and reference sign are both positive, determining the next phase to be the first charging phase; j) if the current phase in which the control circuitry is operating the driver circuit is the first charging phase and error value and reference slope sign are both negative, determining the next phase to be the second recovery phase; and if the next phase is not determined by e), f), g), h), i), and j), determining the next phase to be a repeat of the current phase.

A duration of the third sub-phase, either in the first recovery phase or the second recovery phase, may be indicative of the residual energy present after the second sub-phase. If the duration of the third sub-phase of the first recovery phase approaches zero, the next phase may be to be a first charging phase, and if the duration of the third sub-phase of the second recovery phase approaches zero, the next phase may be a second charging phase.

A duration of each next phase may or may not be predetermined and fixed.

Also disclosed herein is a driver system for a differential piezoelectric actuator system. The driver system includes an inductor and a driver circuit. The driver circuit includes a first switch connected between a first actuator of the differential piezoelectric actuator system and a first inductor node connected to a first terminal of the inductor, a second switch connected between the first inductor node and ground, a third switch connected between the first inductor node and a voltage supply node, the third switch including a first body diode configurable to have its anode connected to the first inductor node and its cathode connected to the voltage supply node, a fourth switch connected between a second inductor node and ground, the second inductor node connected to a second terminal of the inductor, a fifth switch connected between the voltage supply node and the second inductor node, the fifth switch including a second body diode configurable to have its anode connected to the second inductor node and its cathode connected to the voltage supply node, and a sixth switch connected between the second inductor node and a second actuator of the differential piezoelectric actuator system. The driver system includes control circuitry configured to determine whether a next phase in which to operate the driver circuit is a first charging phase, a first recovery phase, a second charging phase, or a second recovery phase based upon feedback signals.

In a first sub-phase of the first charging phase, the control circuitry causes the first and fourth switches to close to transfer energy from the first actuator to the inductor. In a second sub-phase of the first charging phase, the control circuitry causes the third and fourth switches to close to transfer energy from the voltage supply node to the inductor. In a third sub-phase of the first charging phase, the control circuitry causes the second and sixth switches to close to transfer energy from the inductor to the second actuator. In a first sub-phase of the second charging phase, the control circuitry causes the second and sixth switches to close to transfer energy from the second actuator to the inductor. In a second sub-phase of the second charging phase, the control circuitry causes the second and fifth switches to close to transfer energy from the voltage supply node to the inductor. In a third sub-phase of the second charging phase, the control circuitry causes the first and fourth switches to close to transfer energy from the inductor to the first actuator.

In a first sub-phase of the first recovery phase, the control circuitry causes the first and fourth switches to close to transfer energy from the first actuator to the inductor. In a second sub-phase of the first recovery phase, the control circuitry causes the second and fifth switches to close to transfer energy from the inductor to the voltage supply node. In a third sub-phase of the first recovery phase, the control circuitry causes the second and sixth switches to close to transfer energy from the inductor to the second actuator. In a first sub-phase of the second recovery phase, the control circuitry causes the second and sixth switches to close to transfer energy from the second actuator to the inductor. In a second sub-phase of the second recovery phase, the control circuitry causes the third and fourth switches to close to transfer energy from the inductor to the voltage supply node. In a third sub-phase of the second recovery phase, the control circuitry causes the first and fourth switches to close to transfer energy from the inductor to the first actuator.

The control circuitry may be further configured to, in a fourth sub-phase of the charging phase, close the second and fourth switches to keep an inductor current through the inductor fixed, ideally at zero, ready for the next period in which the current may be reversed or not.

The control circuitry may be further configured to, in a fourth sub-phase of the recovery phase, close the second and fourth switches to maintain an inductor current through the inductor as being fixed, ideally at zero, ready for the next period in which the current may be reversed or not.

A duration of the first sub-phase of the first charging phase may be set by the control circuitry based upon the feedback signals from the previous phase, a reference differential voltage, and a reference common mode voltage. A duration of the second sub-phase of the first charging phase may be set by the control circuitry based upon the feedback signals from the previous phase, the reference differential voltage, and the reference common mode voltage. A duration of the third sub-phase of the first charging phase may be set by the control circuitry based upon a zero crossing of an instantaneous value of an inductor current through the inductor.

The feedback signals comprise a differential between the voltages across the first and second actuators, and a common mode of the voltages across the first and second actuators, and a continuous time value of the inductor current.

A duration of the first sub-phase of the first recovery phase may be set by the control circuitry based upon the feedback signals from the previous phase, a reference differential voltage, and a reference common mode voltage. A duration of the second sub-phase of the first recovery phase may be set by the control circuitry based upon the feedback signals from the previous phase, the reference differential voltage, and the reference common mode voltage. A duration of the third sub-phase of the first recovery phase may be set by the control circuitry based upon a zero crossing of an instantaneous value of an inductor current through the inductor.

The feedback signals may be a differential between the voltages across the first and second actuators, a common mode of the voltages across the first and second actuators, and a continuous time value of the inductor current.

The feedback signals may be an average inductor current through the inductor and a differential between the voltages across the first and second actuators, and a common mode of the voltage across the first and second actuators. The control circuitry may determine whether the next phase in which to operate the driver circuit is a charging phase or a recovery phase based upon residual energy present after a third sub-phase of a current phase in which the driver circuit is being operated. The control circuitry may determine whether the next phase in which to operate the driver circuit is the first charging phase, the first recovery phase, the second charging phase, or the second recovery phase based upon the feedback signals by: a) determining an error value to be a difference between the differential between the voltages across the first and second actuators and a reference differential voltage; b) determining a reference sign to be a sign of a current value of a reference differential voltage; c) determining a reference slope sign to be a sign of a current slope of the reference differential voltage; d) determining a residual energy within the inductor; e) if a current phase in which the control circuitry is operating the driver circuit is the second recovery phase and error value and reference sign are both negative, determining the next phase to be the second charging phase; f) if the current phase in which the control circuitry is operating the driver circuit is the second recovery phase and error value and reference slope sign are both positive, determining the next phase to be the first charging phase; g) if the current phase in which the control circuitry is operating the driver circuit is the second charging phase and error value and reference slope sign are both positive, determining the next phase to be the first recovery phase; h) if the current phase in which the control circuitry is operating the driver circuit is the first recovery phase and error value and reference slope sign are both negative, determining the next phase to be the second charging phase; i) if the current phase in which the control circuitry is operating the driver circuit is the first recovery phase and error value and reference sign are both positive, determining the next phase to be the first charging phase; j) if the current phase in which the control circuitry is operating the driver circuit is the first charging phase and error value and reference slope sign are both negative, determining the next phase to be the second recovery phase; and if the next phase is not determined by e), f), g), h), i), and j), determining the next phase to be a repeat of the current phase.

A duration of the third sub-phase, either in the first recovery phase or the second recovery phase, may be indicative of the residual energy present after the second sub-phase. If the duration of the third sub-phase of the first recovery phase approaches zero, the next phase may be a first charging phase, and if the duration of the third sub-phase of the second recovery phase approaches zero, the next phase may be a second charging phase.

The driver circuit further comprises a seventh switch connected between the first inductor node and a high voltage node and an eighth switch connected between the second inductor node and the high voltage node; and wherein the control circuitry is configured to, after each third sub-phase, operate the driver circuit in boost mode to increase a voltage at the high voltage node to be greater than a voltage at the voltage supply node, so that the boost mode is performed during a same switching period as the first sub-phase, second sub-phase, and third sub-phase.

The control circuitry may operate the driver circuit in the boost mode by in a first boost sub-phase, close the second and fifth switches to cause transfer of energy from the voltage supply node into the inductor, and in a second boost sub-phase, close the fourth and seventh switches to thereby boost the voltage at the high voltage node.

The control circuitry may operate the driver in the boost mode by in a first boost sub-phase, close appropriate ones of the switches to cause transfer of energy from the voltage supply node into the inductor, and in a second boost sub-phase, close other appropriate ones of the switches to thereby boost the voltage at the high voltage node.

BRIEF DESCRIPTION OF THE DRAWINGS

FIG. 7 is a table showing the relationship between the current state, error, reference sign, reference slope sign, and next state in which the driver of FIG. 2 is to be operated in.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 2:
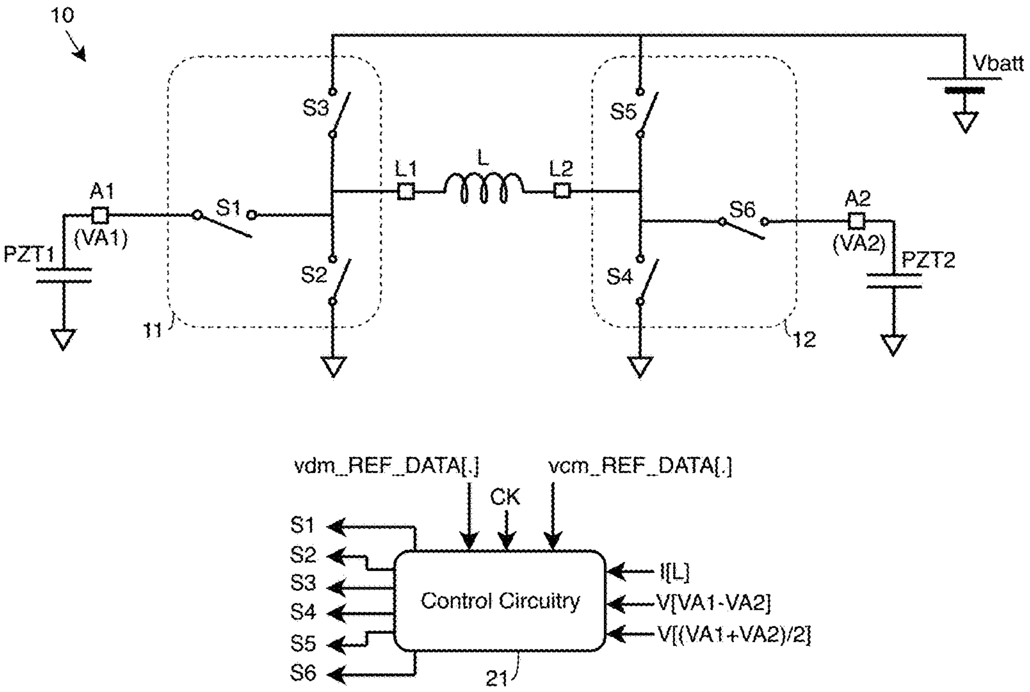
FIG. 2 is a schematic block diagram of a driver for a differential piezoelectric actuator, together with control circuitry for the driver, as disclosed herein.

Disclosed herein with initial reference to FIG. 2 is a driver 10 for a differential piezoelectric actuator PZT1, PZT2, together with control circuitry 21 for the driver 10.

The differential piezoelectric actuator PZT1, PZT2 is represented as two capacitances respectively connected between nodes A1, A2 and ground because, from an electrical point of view, a piezoelectric actuator may be modeled as a capacitor at a first order approximation.

The driver 10 includes a first driver circuit 11 connected between node A1 and node L1, and a second driver circuit 12 connected between node A2 and node L2. The first and second driver circuits 11 and 12 are powered between a battery Vbatt and ground. An external inductor L is connected between nodes L1 and L2. The driver circuits 11, 12 are integrated components (e.g., integrated within an integrated circuit), and the inductor L is an external component.

The driver circuit 11 includes a switch S3 connected between the battery Vbatt and node L1, a switch S2 connected between node L1 and ground, and a switch S1 connected between node A1 and node L1. The driver circuit 12 includes a switch S5 connected between a battery Vbatt and node L2, a switch S4 connected between node L2 and ground, and a switch S6 connected between node A2 and node L2.

The control circuitry 21 is clocked by the clock signal CK, which is the system clock at which the digital blocks operate. This is separate from the switching frequency (Fsw) at which the switches S1-S6 are operated; this switching frequency may be derived from the clock signal CK. By way of example, the clock frequency CK could be 20 MHz, and the switching frequency could be $F_{CK}/20$=1 MHZ.

The control circuitry 21 receives as input the continuous time (instantaneous) value of the current I[L] through the inductor L. The control circuitry 21 averages the continuous time value of the current I[L] over a switching period (Tsw) to produce I_AVG[L], which as an example in the case of $F_{CK}/20=1$ MHz would be an average over as 1 μs switching period. The control circuitry 21 also elaborates the continuous time value of the current I[L] to determine zero crosses thereof, the use of which is described below. The control circuitry 21 also receives as input a first differential voltage V[VA1−VA2] that is the difference between the voltage VA1 at voltage A1 and the voltage VA2 at voltage A2, and a common mode voltage between nodes A1, A2 represented as V[(VA1+VA2)/2]. The control circuitry 21 also receives as input a common mode reference voltage vcm_REF_DATA (represented digitally) and a differential reference voltage vdm_REF_DATA (represented digitally). The differential reference voltage vdm_REF_DATA may represent a saw-tooth signal, or may represent other time varying signals such as sinusoids, which is enabled by the flexibility provided by the control circuitry 21 and driver 10 described herein.

The control circuitry 21 operates, based upon its inputs, to control the switches S1-S6 so as to operate the driver 10 in charging phases and recovery phases, with one charging phase or one recovery phase to be performed per switching period (which is a design parameter, and may be a multiple of the frequency $F_{CK}$ of the clock signal CK). Charging phases occur when charge is to be transferred from PZT1 to PZT2, or from PZT2 to PZT1, and there is insufficient charge from the transferor actuator to fully charge the transferee actuator. Recovery phases occur when charge is to be transferred from PZT1 to PZT2, or from PZT2 to PZT1, and there is more than sufficient charge from the transferor actuator to fully charge the transferee actuator.

Insufficient charge or more than sufficient charge is related to shape of the voltage wave that is to be applied to PZT1 and PZT2. In greater detail, at each switching period, charge is taken from PZT1 and provided to PZT2. The charge taken from PZT1 can be mathematically represented as $$\frac{1}{2} \times C_{PZT} \times [V_{PZT1}(t1) - V_{PZT1}(t0)]^2,$$

and the charge provided to PZT2 can be mathematically represented as $$\frac{1}{2} \times C_{PZT} \times [V_{PZT2}(t1) - V_{PZT2}(t0)]^2.$$

Since $V_{PZT1}$ is different than $V_{PZT2}$, and since some sources for energy losses will be involved in this charge transfer, the imbalance between the two is transferred from or back to the battery Vbatt. This charge imbalance is therefore related to the variation of the potential voltage to be imposed on the actuators PZT1, PZT2 so that the differential voltage V[VA1−VA2] tracks the differential reference voltage vdm_REF_DATA during operation.

The charging phases include C12 (in which energy from the piezoelectric actuator PZT1, as well as energy from the battery Vbatt, is transferred to the inductor L and then the energy stored in the inductor L is transferred to the piezoelectric actuator PZT2) and C21 (in which energy from the piezoelectric actuator PZT2, as well as energy from the battery Vbatt, is transferred to the inductor L and then the energy from the inductor L is transferred to the piezoelectric actuator PZT1). The recovery phases include R12 (in which energy from the piezoelectric actuator PZT1 is transferred to the inductor L and the energy from the inductor L is transferred to the piezoelectric actuator PZT2 while remainder energy within the inductor L is transferred to the battery Vbatt), and R21 (in which energy from the piezoelectric actuator PZT2 is transferred to the inductor L and the energy from the inductor L is transferred to the piezoelectric actuator PZT1 while remainder energy within the inductor L is transferred to the battery Vbatt).

The charging and recovery phases will now be described in detail, and thereafter, the operation of the control circuitry 21 to select which charging phase and which recovery phase to operate the driver 10 in, based upon current inputs, will be described.

Figure 3A:
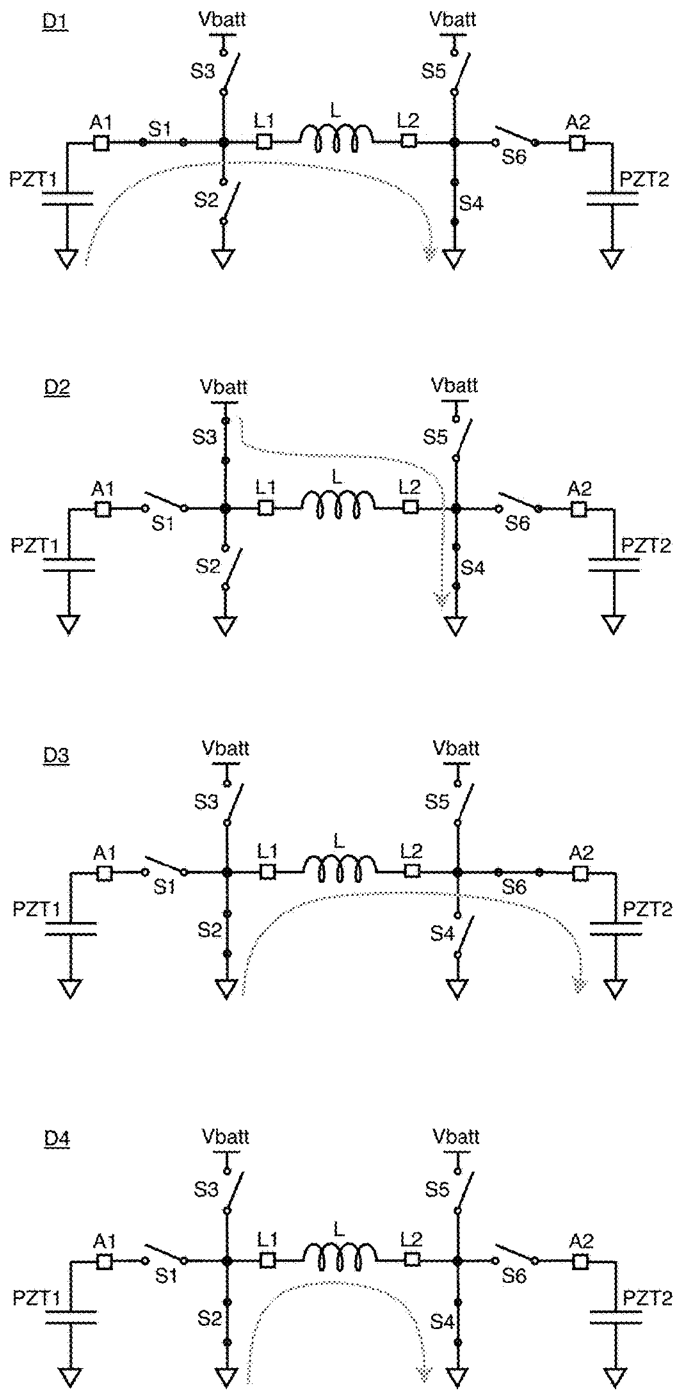
FIG. 3A shows the series of four sub-phases of a first charging phase in which the driver of FIG. 2 may be operated.
Figure 4A:
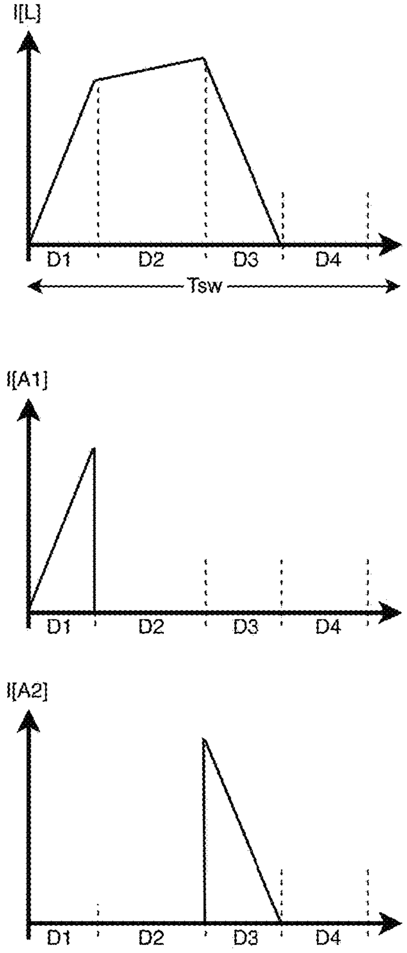
FIG. 4A shows graphs of inductor current and node currents of the driver of FIG. 2 when operating according to the first charging phase of FIG. 3A.

Charging phase C12 is now described with reference to FIGS. 3A and 4A. Charging phase C12 is separated into three sub-phases D1, D2, and D3, followed by a sub-phase D4. In phase C12 sub-phase D1, switches S1 and S4 are closed, while the other switches are kept open, having the effect of transferring energy from the piezoelectric actuator PZT1 to the inductor L for storage. This D1 sub-phase can be observed in FIG. 4A, where the current I[L] through the inductor L rises with a slope of VA1/L, and the current I[A1] flowing out of PZT1 rises with a slope of VA1/L.

Next, in phase C12 sub-phase D2, switches S3 and S4 are closed, while the other switches are kept open, having the effect of transferring energy from the battery Vbatt to the inductor L. The inductor current I[L] rises with a slope of Vbatt/L as a result, as can be observed in FIG. 4A—since the voltage stored across PZT1 is actually greater than the battery voltage Vbatt, notice that the slope Vbatt/L is less than the slope VA1/L (until VA1 is greater than Vbatt) in this example. Note that in other examples, the voltage stored across PZT1 can be lower than Vbatt, in which case the slope VA1/L will be lower than Vbatt/L—therefore, the voltages stored across PZT1 and PZT2 can be close to ground, which is not possible with conventional drivers in which a large amount of headroom with respect to ground is to be maintained.

In phase C12 sub-phase D3, switches S2 and S6 are closed, while the other switches are kept open, having the effect of transferring energy from the inductor L to the piezoelectric actuator PZT2. Since the inductor current I[L] is flowing from the inductor L to PZT2 at this point, the inductor current I[L] falls with a slope of −VA2/L and the current I[A2] flowing into PZT2 falls with a slope of −VA2/L during sub-phase D3, as shown in FIG. 4A.

In phase C12 sub-phase D4, switches S2 and S4 are closed while the other switches are kept open, with the result being that the current is kept fixed, ideally at zero, ready for the next period in which the current may be reversed or not.

Figure 3B:
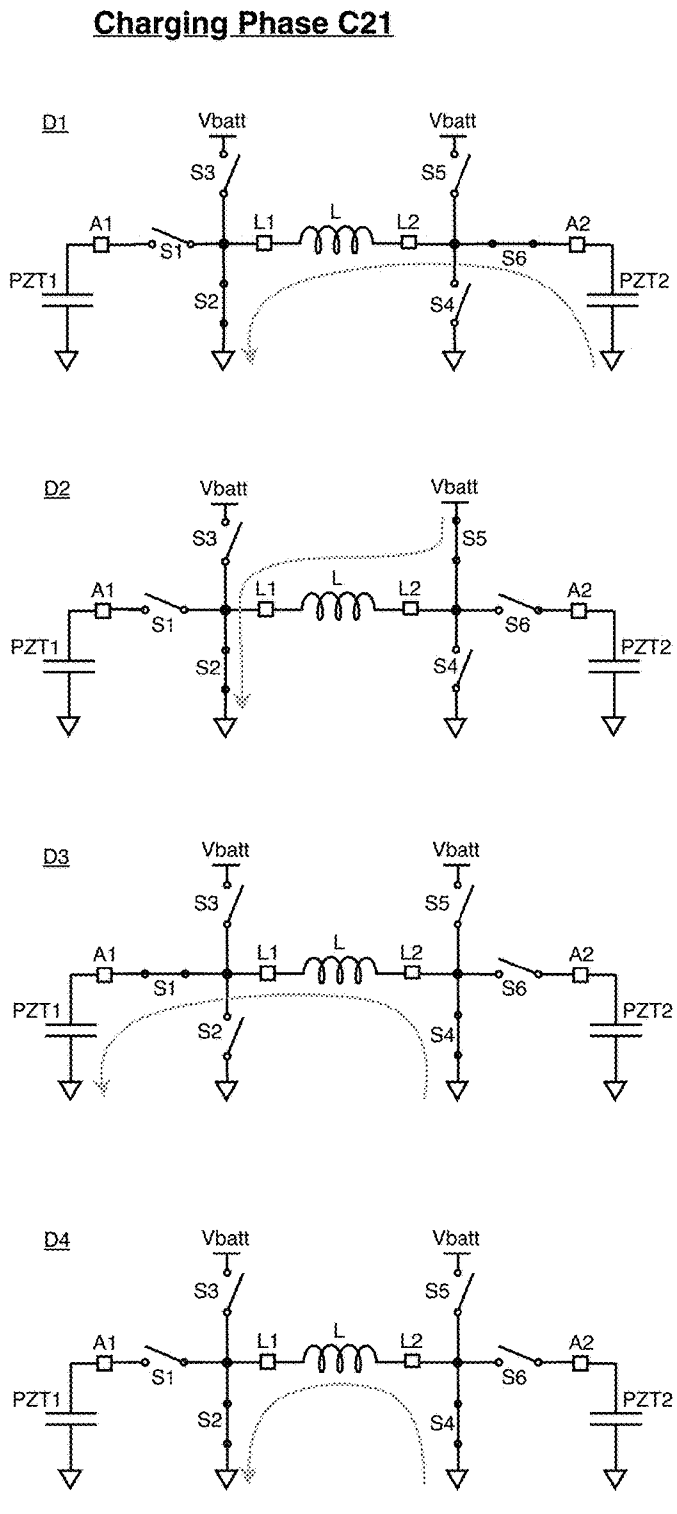
FIG. 3B shows the series of four sub-phases of a second charging phase in which the driver of FIG. 2 may be operated.
Figure 4B:
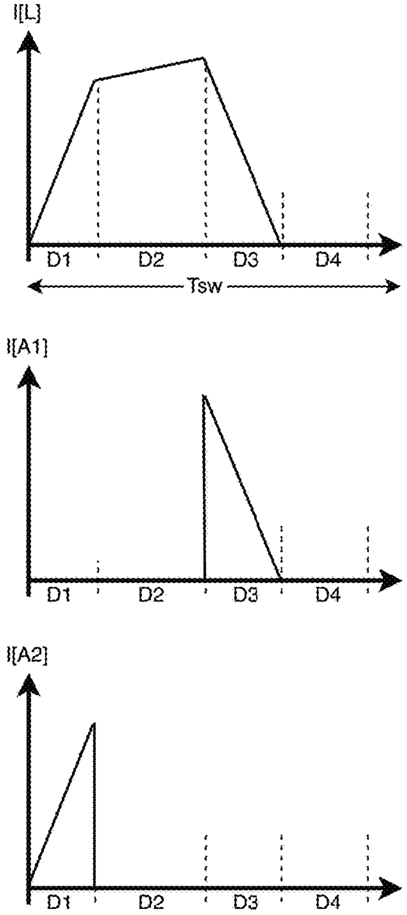
FIG. 4B shows graphs of inductor current and node currents of the driver of FIG. 2 when operating according to the second charging phase of FIG. 3B.

Charging phase C21 is effectively the inverse of charging phase C12, and is now described with reference to FIGS. 3B and 4B. Charging phase C21 is separated into three sub-phases D1, D2, and D3, followed by a sub-phase D4. In phase C21 sub-phase D1, switches S2 and S6 are closed, while the other switches are kept open, having the effect of transferring energy from the piezoelectric actuator PZT2 to the inductor L for storage. This D1 sub-phase can be observed in FIG. 4B, where the current I[L] through the inductor L rises with a slope of VA2/L, and the current I[A2] flowing out of PZT1 rises with a slope of VA2/L.

Next, in phase C21 sub-phase D2, switches S2 and S5 are closed, while the other switches are kept open, having the effect of transferring energy from the battery Vbatt to the inductor L. The inductor current I[L] rises with a slope of Vbatt/L as a result, as can be observed in FIG. 4B—since the voltage stored across PZT2 is actually greater than the battery voltage Vbatt, notice that the slope Vbatt/L is less than the slope VA2/L (until VA2 is greater than Vbatt) in this example.

In phase C21 sub-phase D3, switches S1 and S4 are closed, while the other switches are kept open, having the effect of transferring energy from the inductor L to the piezoelectric actuator PZT1. Since the inductor current I[L] is flowing from the inductor L to PZT1 at this point, the inductor current I[L] falls with a slope of −VA1/L and the current I[A1] flowing into PZT1 falls with a slope of −VA1/L during sub-phase D3, as shown in FIG. 4B.

In phase C21, sub-phase D4, switches S2 and S4 are closed while the other switches are kept open, with the result being that the current is kept fixed, ideally at zero, ready for the next period in which the current may be reversed or not.

Figure 5A:
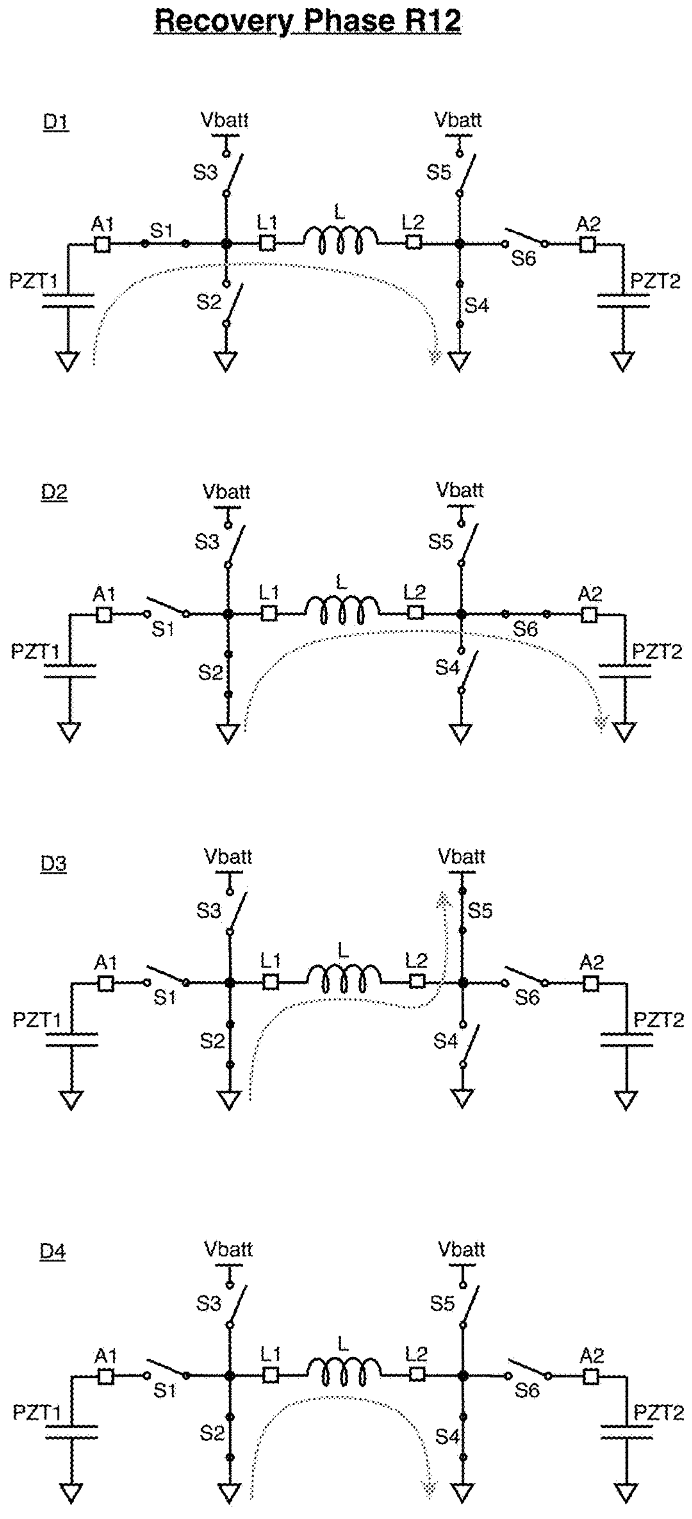
FIG. 5A shows the series of four sub-phases of a first recovery phase in which the driver of FIG. 2 may be operated.

Recovery phase R12 is now described with reference to FIGS. 5A and 6A. Recovery phase R12 is separated into three sub-phases D1, D2, and D3, followed by sub-phase D4. In phase R12 sub-phase D1, switches S1 and S4 are closed, while the other switches are kept open, having the effect of transferring energy from the piezoelectric actuator PZT1 to the inductor L for storage. This D1 sub-phase can be observed in FIG. 6A, where the current I[L] through the inductor L rises with a slope of VA1/L, and the current I[A1] flowing out of PZT1 rises with a slope of VA1/L.

Next, in phase R12 sub-phase D2, switches S2 and S6 are closed, while the other switches are kept open, having the effect of transferring energy from the inductor L to the piezoelectric actuator PZT2. Since the inductor current I[L] is flowing from the inductor L to PZT2 at this point, the inductor current I[L] falls with a slope of −VA2/L and the current I[A2] flowing into PZT2 falls with a slope of −VA2/L during sub-phase D2, as shown in FIG. 6A.

Figure 6A:
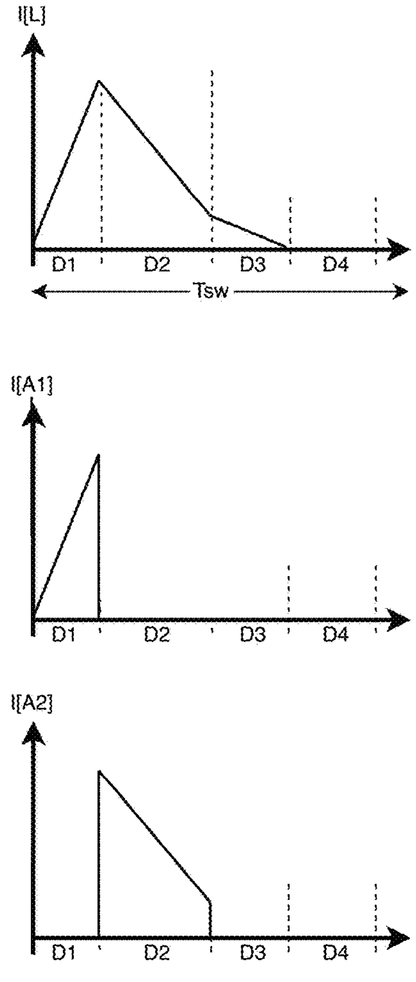
FIG. 6A shows graphs of inductor current and node currents of the driver of FIG. 2 when operating according to the first recovery phase of FIG. 5A.

In phase R12 sub-phase D3, switches S2 and S5 are closed, while the other switches are kept open, having the effect of transferring remainder energy left in the inductor L to the battery D3, with the inductor current I[L] falling with a slope of −Vbatt/L as a result as shown in FIG. 6A.

In phase R12, sub-phase D4, switches S2 and S4 are closed while the other switches are kept open, with the result being that the current is kept fixed, ideally at zero, ready for the next period in which the current may be reversed or not.

Figure 5B:
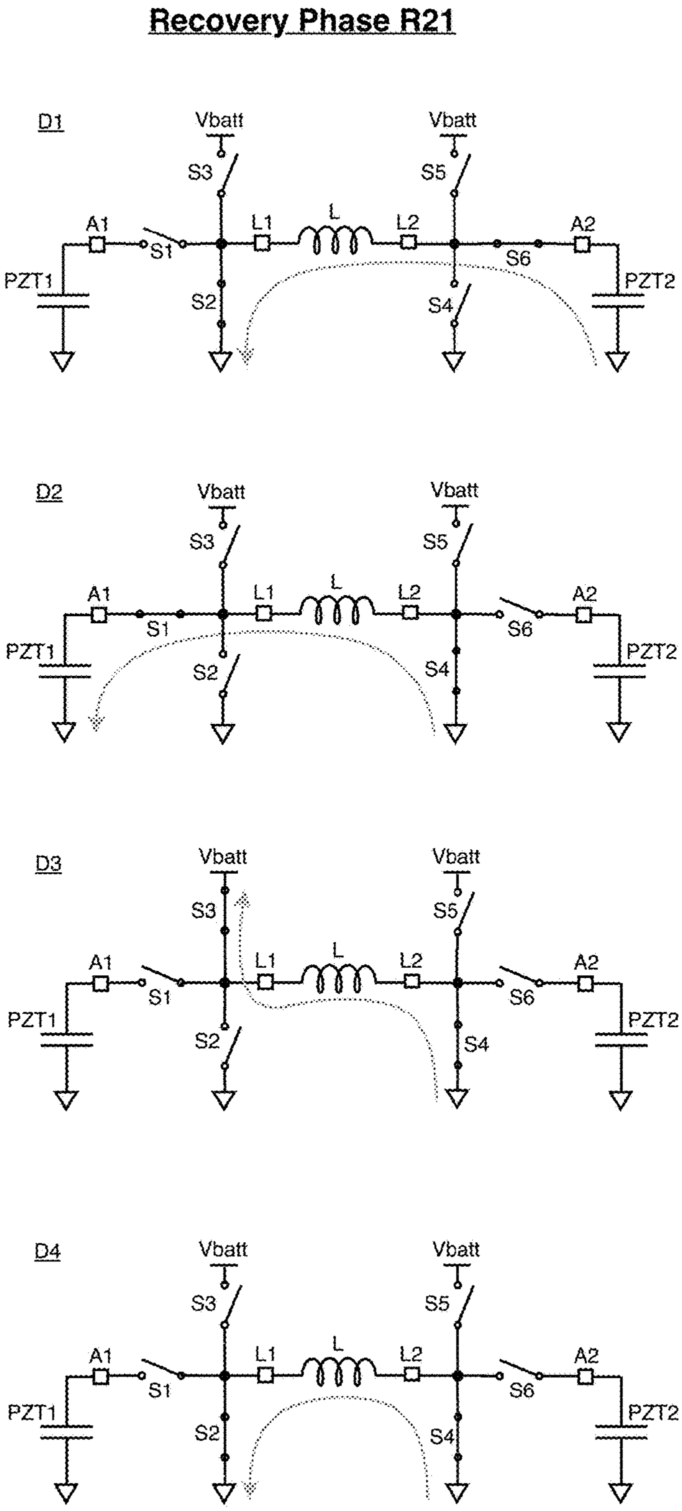
FIG. 5B shows the series of four sub-phases of a second recovery phase in which the driver of FIG. 2 may be operated.

Recovery phase R21 is effectively the inverse of recovery phase R12, and is now described with reference to FIGS. 5B and 6B.

Recovery phase R21 is separated into three sub-phases D1, D2, and D3, followed by sub-phase D4. In phase R21 sub-phase D1, switches S2 and S6 are closed, while the other switches are kept open, having the effect of transferring energy from the piezoelectric actuator PZT2 to the inductor L for storage. This D1 sub-phase can be observed in FIG. 6B, where the current I[L] through the inductor L rises with a slope of VA2/L, and the current I[A2] flowing out of PZT2 rises with a slope of VA2/L.

Next, in phase R21 sub-phase D2, switches S1 and S4 are closed, while the other switches are kept open, having the effect of transferring energy from the inductor L to the piezoelectric actuator PZT1. Since the inductor current I[L] is flowing from the inductor L to PZT1 at this point, the inductor current I[L] falls with a slope of −VA1/L and the current I[A1] flowing into PZT1 falls with a slope of −VA1/L during sub-phase D2, as shown in FIG. 6B.

Figure 6B:
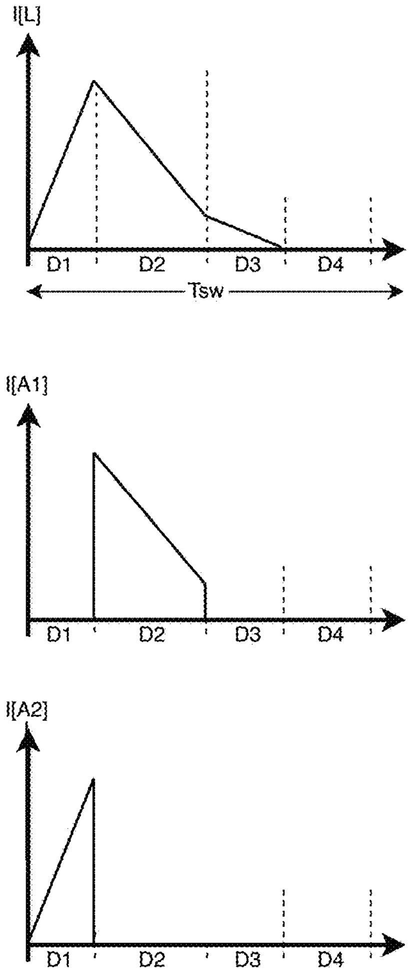
FIG. 6B shows graphs of inductor current and node currents of the driver of FIG. 2 when operating according to the second recovery phase of FIG. 5B.

In phase R21 sub-phase D3, switches S3 and S4 are closed, while the other switches are kept open, having the effect of transferring remainder energy left in the inductor L to the battery D3, with the inductor current I[L] falling with a slope of −Vbatt/L as a result as shown in FIG. 6B.

When phase R21 sub-phase D4 is performed, switches S2 and S4 are closed while the other switches are kept open, with the result being that the current is kept fixed, ideally at zero, ready for the next period in which the current may be reversed or not.

Operation of the control circuitry 21 to select which charging phase and which recovery phase to operate the driver 10 in, based upon current inputs, will be described. The voltage V[VA1−VA2] is the differential output voltage, and the difference between the differential output voltage V[VA1−VA2] and the differential reference voltage vdm_REF_DATA can be referred to as the "error". The current sign of the differential reference voltage vdm_REF_DATA can be referred to as the "reference sign", and the current sign of the slope of the differential reference voltage vdm_REF_DATA can be referred to as the "reference slope sign".

A single switching period is represented in the graphs of FIGS. 4A-4B and 6A-6B. At the end of each switching period, the control circuitry 21 determines which phase (either a charging phase or a recovery phase, and in which direction charge transfer occurs, whether it be from PZT1 to PZT2 or from PZT2 to PZT1) in which to control the driver 10 during the next switching period, based upon the current phase, the error, the reference sign, and the reference slope sign. The relationships between the current phase, error, reference sign, reference slope sign, and the next phase are now described with additional reference to the table of FIG. 7.

If the current phase is the recovery phase R21 and both the error and the reference sign are negative, then the next phase that the control circuitry 21 controls the driver 10 to be in is the charging phase C21.

If the current phase is the recovery phase R21 and both the error and the reference slope sign are both positive, then the next phase that the control circuitry 21 controls the driver 10 to be in is the charging phase C12.

If the current phase is the charging phase C21 and both the error and reference slope sign are positive, then the next phase that the control circuitry 21 controls the driver 10 to be in is the recovery phase R12.

If the current phase is the recovery phase R12 and both the error and reference slope sign are negative, then the next phase that the control circuitry 21 controls the driver 10 to be in is the charging phase C21.

If the current phase is the recovery phase R12 and both the error and reference sign are positive, then the next phase that the control circuitry 21 controls the driver 10 to be in is the recovery phase C12.

If the current phase is the charging phase C12 and both the error and reference slope sign are negative, then the next phase that the control circuitry 21 controls the driver 10 to be in is the recovery phase R21.

The above relationships between the current state, error, reference sign, reference slope sign set the next state as shown in table form in FIG. 7. If none of the conditions in the table of FIG. 7 can be verified, then the next state will be the current state (e.g., the state will not change).

The state change condition from recovery (either R12 or R21) to charge (C21 or C12) can be related to the residual energy after the D2 sub-phase. Specifically, the time duration of sub-phase D3 in the recovery phase is related to the extra energy stored in the inductor L, which in this sub-phase is transferred back to the battery. When the time duration of sub-phase D3 in the recovery phase approaches zero, it means that extra energy is not stored in the inductor L and therefore the next phase is to be a charging phase. Therefore, a state change condition can be added to the one described before, with this being related to state change from recovery to charge (R21 to C12 or R12 to C21) and the condition is the time duration of sub-phase D3 which approaches zero.

The pulse-widths of sub-phases D1 and D2 are determined by the control circuitry 21 based upon the value of the signals it receives as feedback, namely the differential voltage V[VA1−VA2] and common mode voltage V[(VA1+VA2)/2] as well as the continuous time value of the inductor current I[L] to be averaged over one period (i.e., I_AVG[L]). In general though, for whatever phase is to be performed, each feedback signal may be utilized. From a mathematical point of view, the control circuity 21 effectively use the voltages VA1 and VA2, but derives them from the measured differential and common mode voltages. This because it is more advantageous to implement a single double-ended differential readout circuit rather than two single-ended readout circuits.

The pulse-width D3 is instead defined by looking at the instantaneous value of the inductor current I[L] and, more precisely, by looking for the zero crossing.

Figure 8:
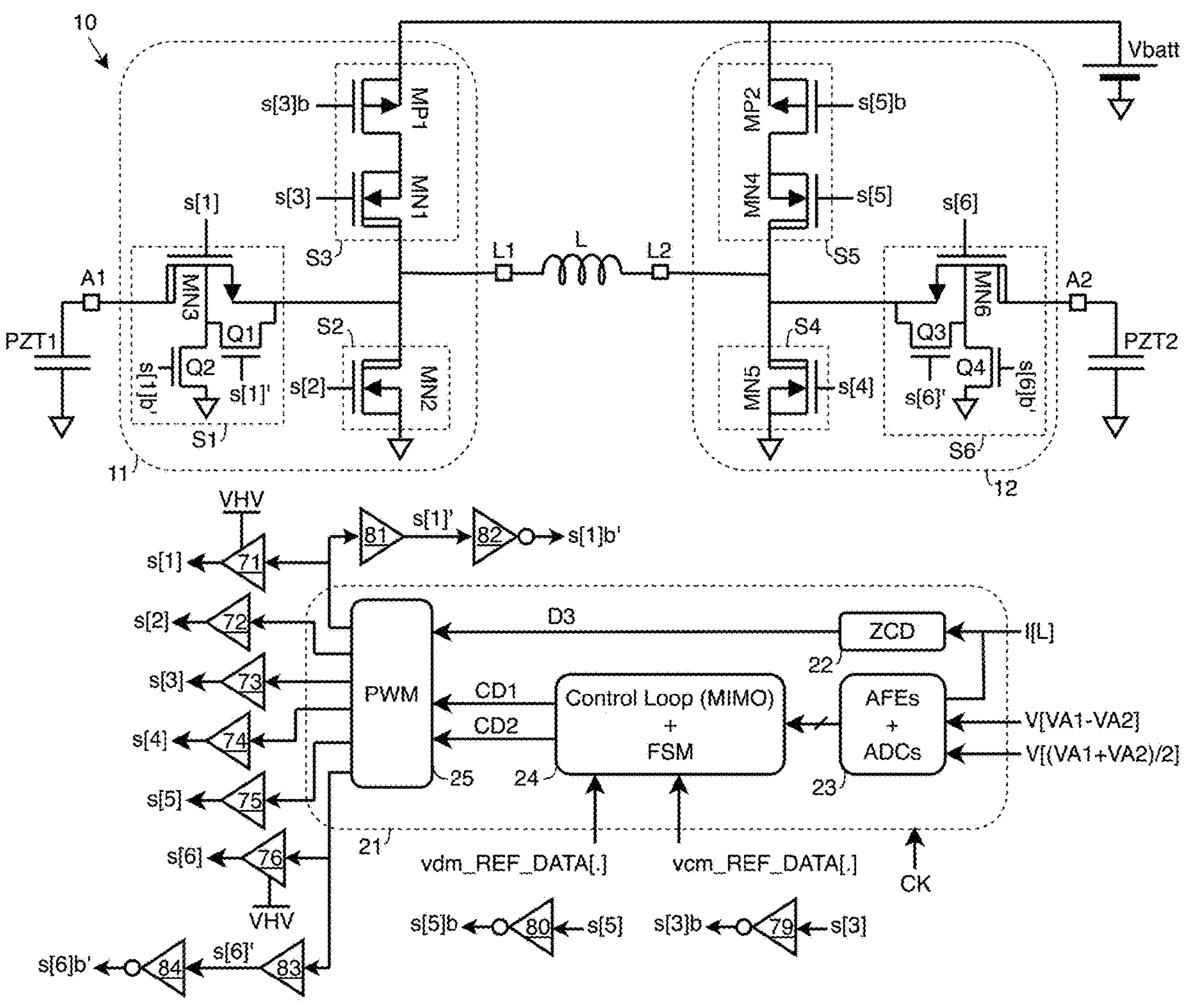
FIG. 8 is a schematic block diagram of a first detailed embodiment of a driver for a differential piezoelectric actuator, together with control circuitry for the driver, as disclosed herein.

A first detailed embodiment of the driver 10 and control circuitry 21 is now described with reference to FIG. 8. In this embodiment, the switch S3 may be formed by: a first p-channel transistor MP1 having a source connected to the battery Vbatt, a drain connected to a source of a first n-channel transistor MN1, and a gate receiving a gate drive signal s[3]b; and the first high-voltage n-channel transistor MN1 having its source connected to the drain of MP1, its drain connected to node L1, and its gate receiving a gate drive signal s[3], the gate drive signal s[3]b being a complement of the gate drive signal s[3]. The bulk of MP1 is connected to the source of MP1, and the bulk of MN1 is connected to the source of MN1, The switch S2 may be formed by a second high-voltage n-channel transistor MN2 having its drain connected to node L1, its source connected to ground, and its gate receiving a gate drive signal s[2]. The bulk of MN2 is connected to the source of MN2.

The switch S1 may be formed by a third high-voltage n-channel transistor MN3 having its drain connected to node A1, its source connected to node L1, and its gate receiving a gate drive signal s[1]. The n-channel transistor MN3 may be a high-voltage transistor, with the gate drive signal s[1] being a high voltage drive signal (e.g., on the order of 50V+). The bulk of MN3 is connected to the source of MN3 by switch Q1 when a low-voltage domain version s[1]' of the gate drive signal s[1] is at a logic high, and is connected to ground by switch Q2 when the inverse s[1]b' of the low-voltage domain gate drive signal s[1]' is at a logic high.

The switch S5 may be formed by: a second p-channel transistor MP2 having a source connected to the battery Vbatt, a drain connected to a source of a fourth high-voltage n-channel transistor MN4, and a gate receiving a gate drive signal s[5]b; and the fourth n-channel transistor MN4 having its source connected to the drain of MP2, its drain connected to node L2, and its gate receiving a gate drive signal s[5], the gate drive signal s[5]b being a complement of the gate drive signal s[5]. The bulk of MP2 is connected to the source of MP2, and the bulk of MN4 is connected to the source of MN4.

The switch S4 may be formed by a fifth high-voltage n-channel transistor MN5 having its drain connected to node L2, its source connected to ground, and its gate receiving a gate drive signal s[4]. The bulk of MN5 is connected to the source of MN5.

The switch S6 may be formed by a sixth n-channel transistor MN6 having its drain connected to node A2, its source connected to node L2, and its gate receiving a gate drive signal s[6]. The n-channel transistor MN6 may be a high-voltage transistor, with the gate drive signal s[6] being a high voltage drive signal (e.g., on the order of 50V+). The bulk of MN6 is connected to the source of MN6 by switch Q3 when a low-voltage domain version s[6]' of the gate drive signal s[6] is at a logic high, and is connected to ground by switch Q4 when the inverse s[6]b' of the low-voltage domain gate drive signal s[6]' is at a logic high.

The above described transistors may be formed from any technology suitable to produce transistors capable of withstanding the voltages to be utilized for the driver design.

The control circuitry 21 includes a zero cross detector (ZCD) 22 that receives the current I[L] and asserts a control signal D3 when the current I[L] crosses zero. Respective analog front ends (AFEs) and analog to digital converters (ADCs) within the control circuitry 21, collectively reference 23, receive the differential voltage V[A1−A2] and the common mode voltage V[(A1+A2)/2], digitally filtering the results in appropriate bandwidths, and provide them as output to a multi-input multi-output (MIMO) control loop and finite state machine (FSM) within the control circuitry 21, collectively reference 24. The MIMO control loop and FSM 24 also receives the average inductor current I_AVG[L] over one switching period when it is to be evaluated for whatever phase is to be performed. The MIMO control loop/FSM 24 also receives the common mode reference voltage vcm_REF_DATA and the differential reference voltage vdm_REF_DATA as input.

The MIMO control loop/FSM 24 generates the control values CD1, CD2 as output based upon its inputs. In particular the FSM 24, by looking at the relationships between the current state, error, reference sign, reference slope sign, sets the next state as shown in table form in FIG. 7. If none of the conditions in the table of FIG. 7 can be verified, then the next state will be the current state (e.g., the state will not change). D3 is defined by looking at the instantaneous value of the inductor current I[L] and, more precisely, by looking for a zero crossing thereof.

A pulse width modulation (PWM) circuit 25 receives the control values CD1, CD2, and the signal D3, and, based on that, generates the gate drive signals s[1], s[2], s[3], s[4], s[5], s[6]. The gate drive signals s[1] and s[6] are passed through high-voltage drivers 71, 76 to become high-voltage domain signals, while the gate drive signals s[2], and s[4] are passed through standard drivers 72, 74, while the gate drive signals s[3] and s[5] are passed through boot-strapped drivers 73 and 75 that drive s[3] and s[5] to values higher than Vbatt. The gate drive signal s[3]b is generated by passing the gate drive signal s[3] through an inverter 79, and the gate drive signal s[5]b is generated by passing the gate drive signal s[5] through an inverter 80. The low-voltage domain gate drive signal s[1]' is generated by the PWM circuit 25 as having the same logic level as s[1], and is passed through a standard gate driver 81 to an inverter 82 to thereby generate the low-voltage domain gate drive signal s[1]b'. The low-voltage domain gate drive signal s[6]' is generated by the PWM circuit 25 as having the same logic level as s[6], and is passed through a standard gate driver 83 to an inverter 84 to thereby generate the low-voltage domain gate drive signal s[6]b'.

Figure 9:
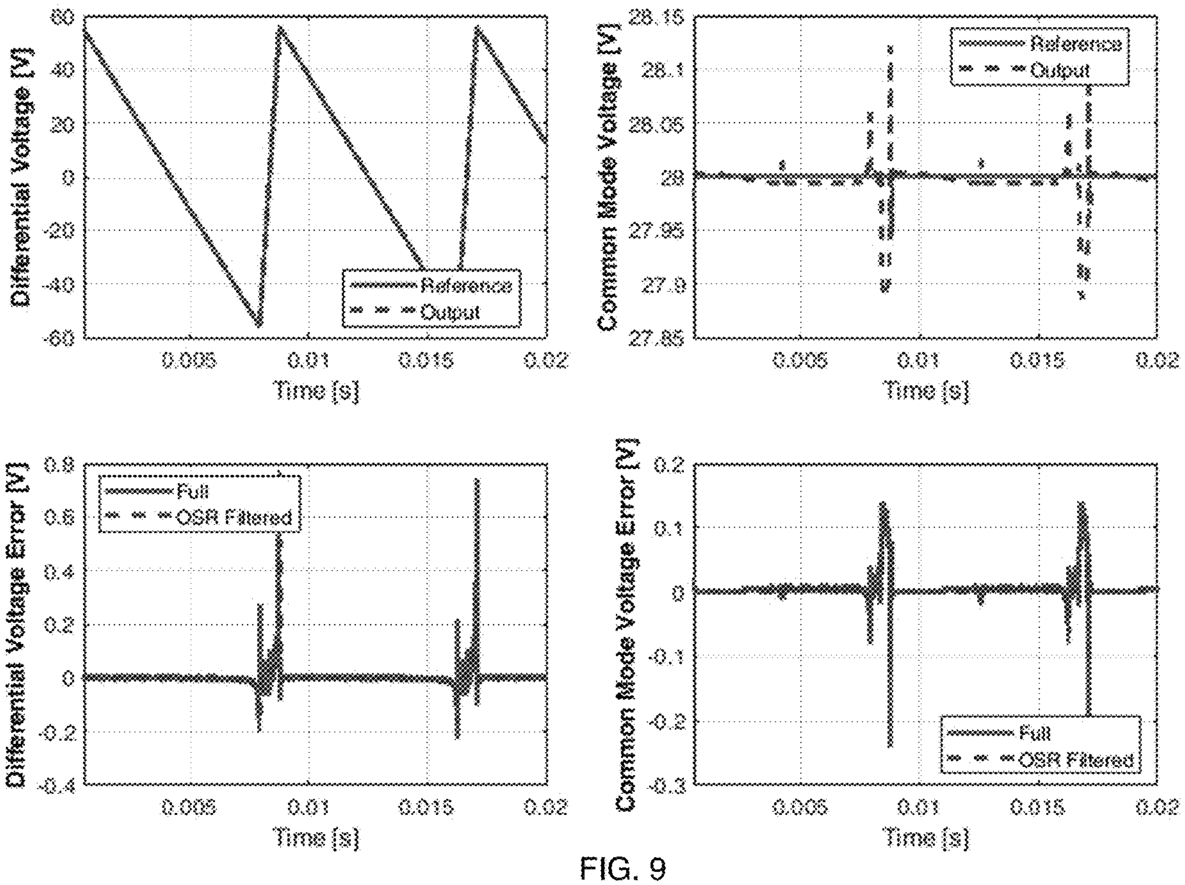
FIG. 9 is a series of graphs of voltage values of the driver of FIG. 8 during operation.
Figure 10:
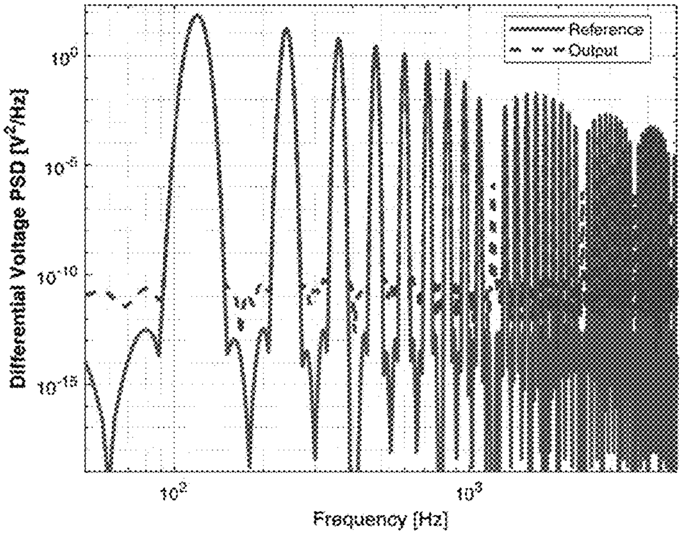
FIG. 10 is a graph of power spectral density of the output differential voltage of the driver of FIG. 8 during operation.

Graphs of values of voltages within the driver 10 are seen in FIG. 9, where it can be observed that the control is sufficient for the differential output voltage to well match the reference differential voltage, and for the common mode voltage to well match the reference common mode voltage. A graph of power spectral density can be seen in FIG. 10, where it can be seen that the output PSD well matches the reference.

Figure 11:
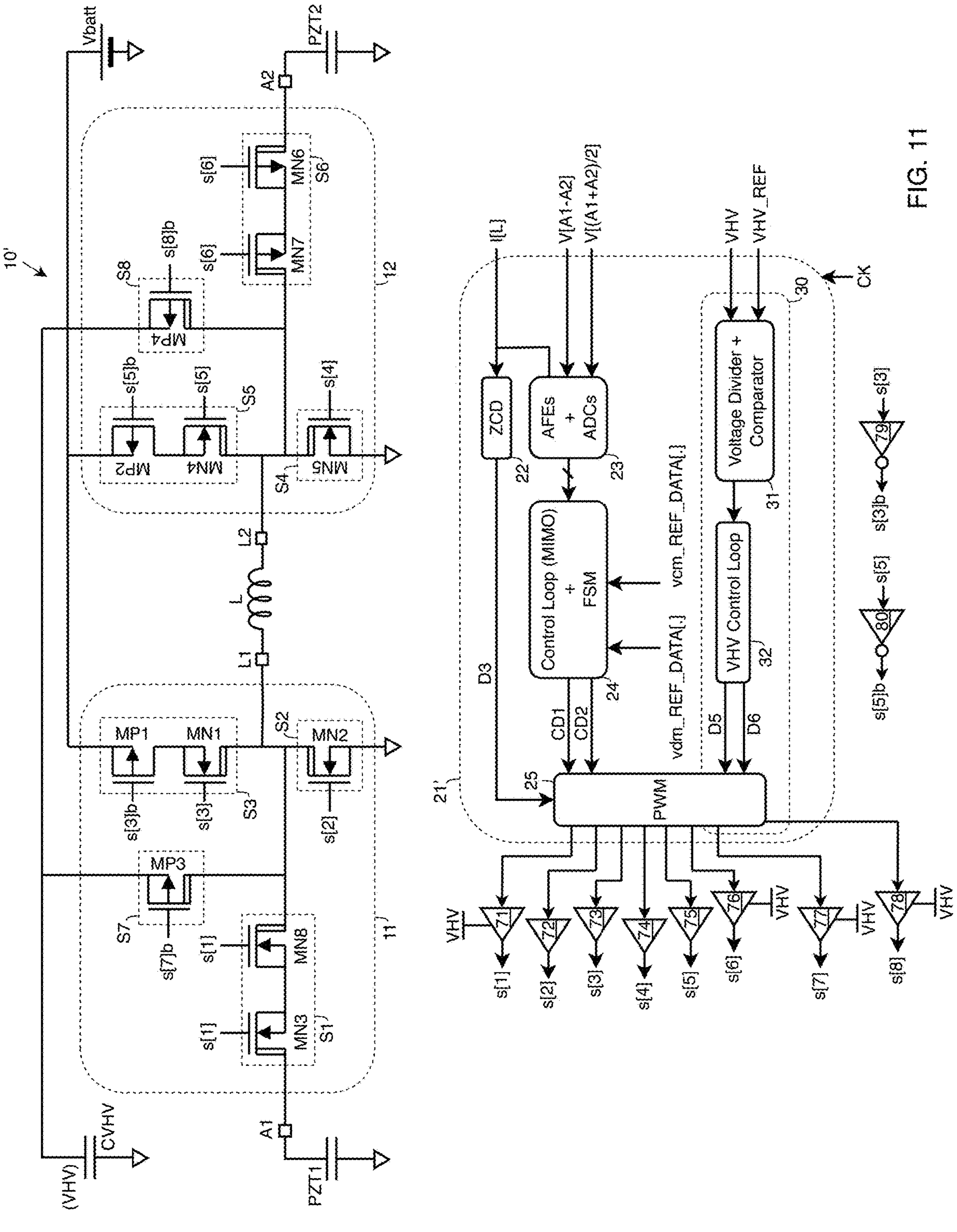
FIG. 11 is a schematic block diagram of a second detailed embodiment of a driver for a differential piezoelectric actuator including an integrated boost converter, together with control circuitry for the driver, as disclosed herein.

In the above-described embodiment, the high voltage VHV is generated by a boost converter external to the driver 10. However, the inductor L already present within the driver 10 may be exploited in another embodiment to be part of a boost converter internal to the driver, as now described with reference to the driver 10' of FIG. 11. The driver 10' contains the additions of a switch S7 connected between node L1 and a capacitor CVHV across which the high voltage VHV (on the order of 50+ V) is formed, as well as a switch S8 connected between node L2 and the capacitor CVHV. The switch S7 is formed by a high-voltage p-channel transistor MP3 having its source connected to the capacitor CVHV, its drain connected to node L1, and its gate receiving a gate drive signal s[7]b. The bulk of MP3 is connected to the source of MP3. The switch S8 is formed by a high-voltage p-channel transistor MP4 having its source connected to the capacitor CVHV, its drain connected to node L2, and its gate receiving a gate drive signal s[8]b. The bulk of MP4 is connected to the source of MP4. In addition, in the driver 10', the switch S1 includes an n-channel transistor MN8 connected between the n-channel transistor MN3 and node L1, with MN8 having its source connected to the source of MN3, its drain connected to node L1, and its gate also receiving the gate drive signal s[1]. The bulk of MN8 is connected to the source of MN8, and here note that the bulk of MN3 is connected to the source of MN3 Furthermore, in the driver 10', the switch S6 includes an n-channel transistor MN7 connected between the n-channel transistor MN6 and node L2, with MN7 having its source connected to the source of MN6, its drain connected to node L2, and its gate also receiving the gate drive signal s[6]. The bulk of MN7 is connected to the source of MN7, and here note that the bulk of MN6 is connected to the source of MN6.

Figure 12:
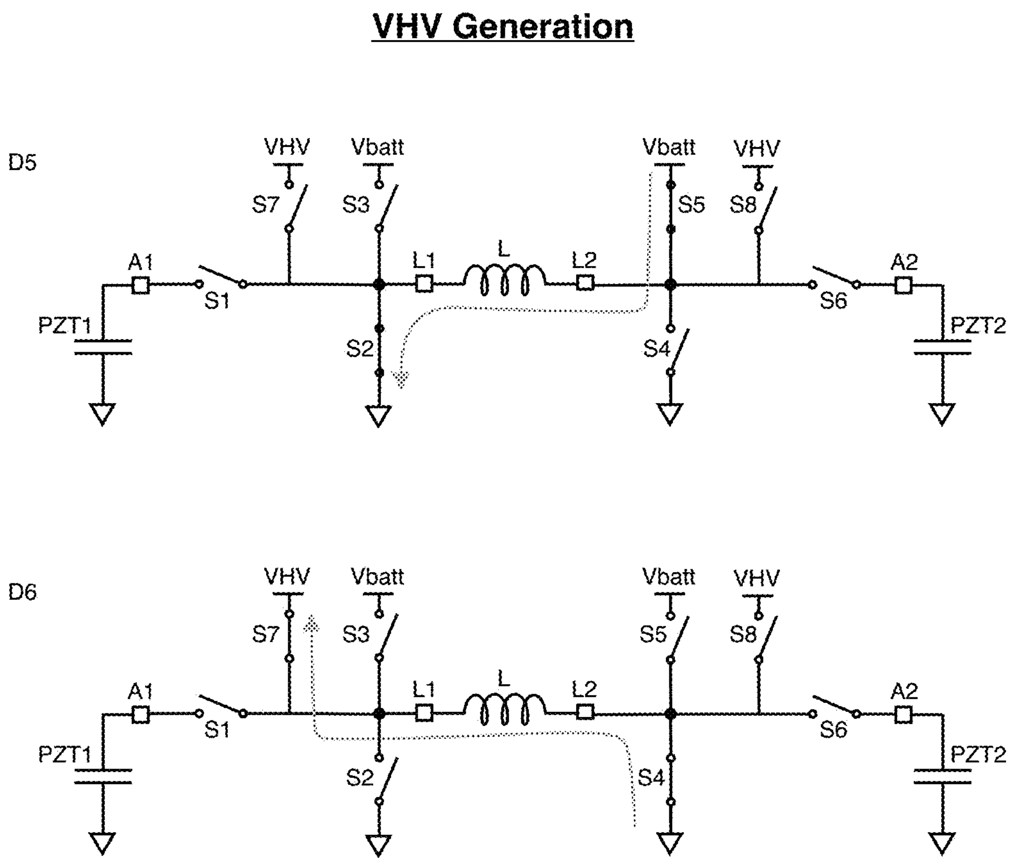
FIG. 12 shows a series of two sub-phases such as may be inserted into the charging phases or recovery phases of the driver of FIG. 11 so as to operate the driver as a boost converter.

The specifics of the control circuitry 21' for this embodiment will be described below, but first the VHV generation sub-phases D5 and D6 in which the control circuitry 21' operates the driver 10' during each switching period will now be described with additional reference to FIG. 12. Note that in this embodiment, sub-phase D4 is performed after D6. More precisely, the sub-phase D4 is performed whenever (D1+D2+D3+D5+D6)*Tsw<Tsw. If so, the sub-phase D4 is performed after D6 and its duration will be D4=1−(D1+D2+D3+D5+D6), thus covering the possible remainder time from the end of the sub-phase D6 to the end of Tsw.

In VHV generation sub-phase D5, the control circuitry 21' closes switches S2 and S5 while leaving the other switches open. As a result, current flows from the battery Vbatt into the inductor L, generating a magnetic field and thereby storing energy in the inductor L. In VHV generation sub-phase D6, the control circuitry 21' closes switches S4 and S7 while leaving the other switches open. The flow of current in the inductor from nodes L2 to L1 falls, and the strength of the magnetic field collapses as the stored energy is converter to current to attempt to maintain the current output from the inductor L. As a result, node L2 goes positive, meaning that the voltage across the inductor L from node L1 to node L2 is in series with the voltage being formed across capacitor CVHV, thereby providing a boosted voltage VHV to the capacitor CVHV which is greater than the battery voltage Vbatt. As such, generation sub-phases D5 and D6 serve to cause the driver 10' to operate as a boost converter. It should be appreciated that this pattern of operation in the generation sub-phases D5 and D6 is but a possibility, and that in fact, VHV can be generated through different switching patterns—for example, in sub-phase D5, switches S2 and S5 could be closed while in sub-phase D6, switches S5 and S7 are closed.

Returning to the control circuitry 21', the control circuitry 21' additionally includes a boost controller 30 that generates control signals D5 and D6 from which the PWM circuit 25 generates the gate drive signals s[7] and s[8] according to the duration of the control signals D5 and D6. The boost controller 30 includes a comparator 30 that compares the current voltage VHV formed across the capacitor CVHV to a reference high voltage VHV_REF and asserts its output when VHV becomes equal to VHVREF. A control loop 32 receives the output of the comparator 30 and from it generates the control signals D5 and D6.

Figure 1:
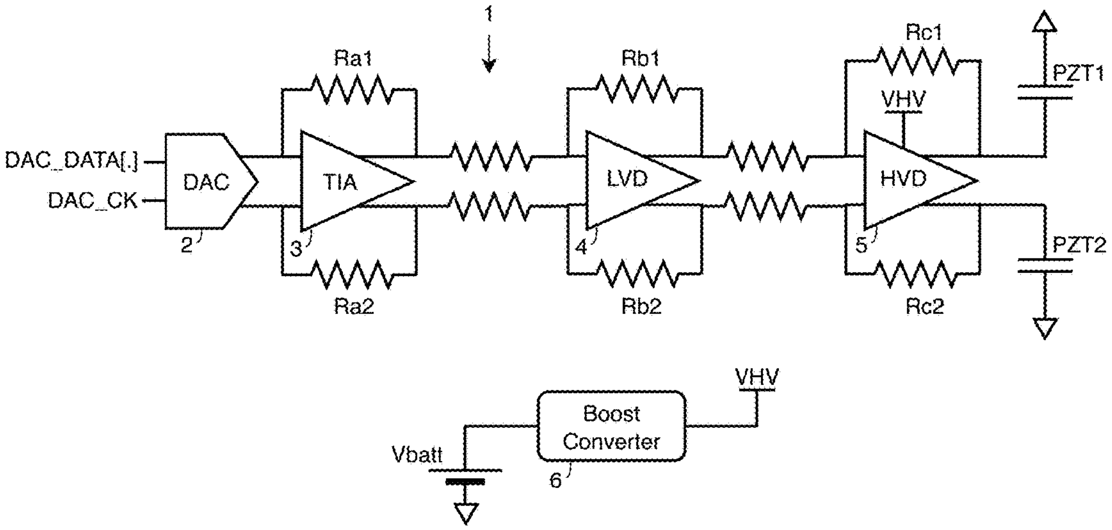
FIG. 1 (Prior Art)
FIG. 1 is a schematic block diagram of a prior art driver for a differential piezoelectric actuator.

Advantages of the driver 10, 10' designs described above will now be described. First off, efficiency is high due to the transfer of energy between the actuators PZT1 and PZT2 instead of the discharge of that energy to ground as well as the recovery by the battery of excess energy stored in the inductor L, without the energy consumption that would be caused by the quiescent currents in the various amplifiers of prior art designs (for example the HVD 5 of FIG. 1). Indeed, the limit on efficiency in these designs is simply that imposed by real world devices, such as the on-resistances of the devices forming the switches, the resistance of the inductor L, and the power consumption involved with the generation of the high voltage VHV.

Still further, the value of the capacitances of the actuators PZT1 and PZT2 is not a concern for stability or bandwidth because the use of a high voltage amplifier in the prior art is eliminated by the designs described herein. In addition, the designs described herein permit the increase of output full-scale, and the output differential voltage V[VA1−VA2] is effectively oversampled, which can be exploited in order to increase bandwidth and achieve increased output accuracy.

This ability to increase bandwidth permits the selection of the switching frequency as a trade-off between accuracy and power-consumption, and permits the driver to be used to drive a resonant device (e.g., micromirror).

While static power consumption of the components other than the driver is to be taken into account, the reduction in power consumption by the driver provides for an overall strong reduction in power consumption compared to prior systems utilizing prior drivers. In addition, assuming the control loop 32 is robust, feedback signals other than the differential output voltage have relaxed accuracy requirements. Noise performance is increased as well, with the relatively low noise present being related to PWM jitter and the driving of the switches as well as the noise of the feedback circuit.

It is clear that modifications and variations may be made to what has been described and illustrated herein, without thereby departing from the scope of this disclosure, as defined in the annexed claims. For example, in the embodiments described, the timing in the recovery phase R12 when switching from sub-phase D1 (with switches S1 and S4 closed) to sub-phase D2 (with switches S2 and S5 closed) is to be precise due to the fact that switch S5 is to close substantially simultaneously to the opening of switch S4. This is performed to provide for the current across the inductor L to flow continuously without interruption. If this switchover from sub-phase D1 to sub-phase D2 is performed incorrectly, the abrupt interruption in inductor current may cause a high voltage to appear at node L2, potentially causing damage. These same considerations, naturally, also apply to the recovery phase R21.

Figure 13:
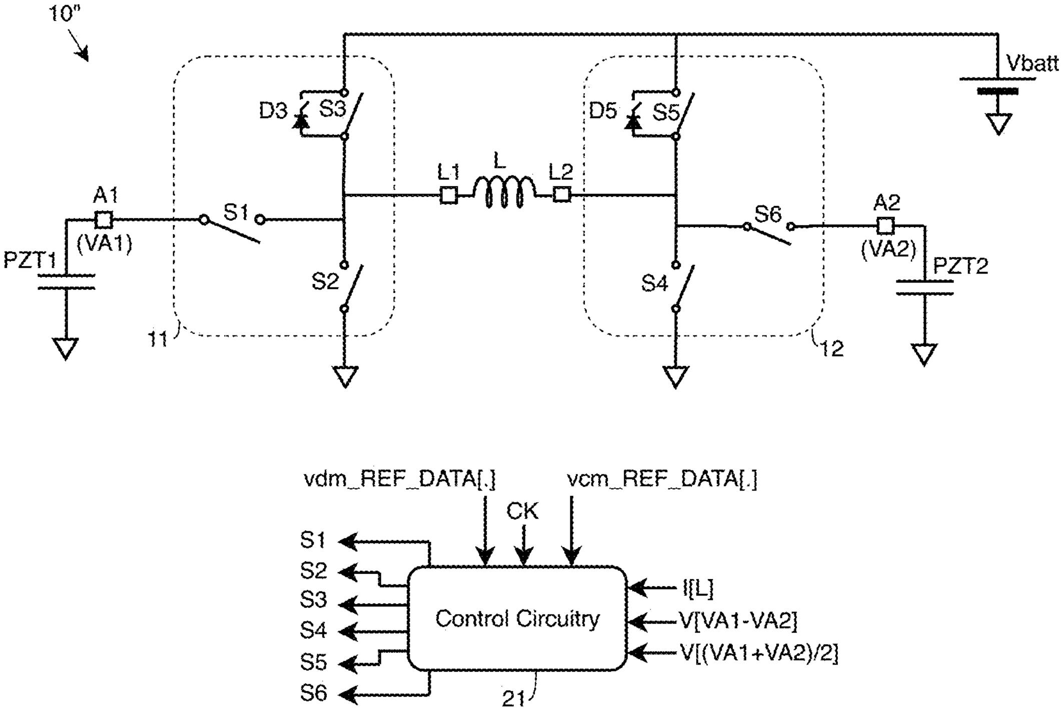
FIG. 13 is a schematic block diagram of a driver for a differential piezoelectric actuator, together with control circuitry for the driver, as disclosed herein.

Therefore, to facilitate an embodiment in which more imprecise timing may be used, the embodiment of FIG. 13 was developed. The difference between the embodiments of FIG. 13 and FIG. 2 is that in the embodiment of FIG. 13, the switch S3 is a MOS transistor which includes an intrinsic body diode D3 having its anode connected to node L1 and its cathode connectable to the battery voltage Vbatt, and the switch S5 is a MOS transistor which includes an intrinsic body diode D5 that similarly has its anode connected to node L2 and its cathode connectable to the battery voltage Vbatt. Appreciate that the body diodes are intrinsic to the structure of the MOS devices, as stated, and are not discrete devices.

Recovery phase R12 is now described with reference to FIGS. 14A and 15A. Recovery phase R12 is separated into three sub-phases D1, D2, and D3, followed by sub-phase D4. In phase R12 sub-phase D1, switches S1 and S4 are closed, while the other switches are kept open, having the effect of transferring energy from the piezoelectric actuator PZT1 to the inductor L for storage. This D1 sub-phase can be observed in FIG. 15A, where the current I[L] through the inductor L rises with a slope of VA1/L, and the current I[A1] flowing out of PZT1 rises with a slope of VA1/L.

Figure 14A:
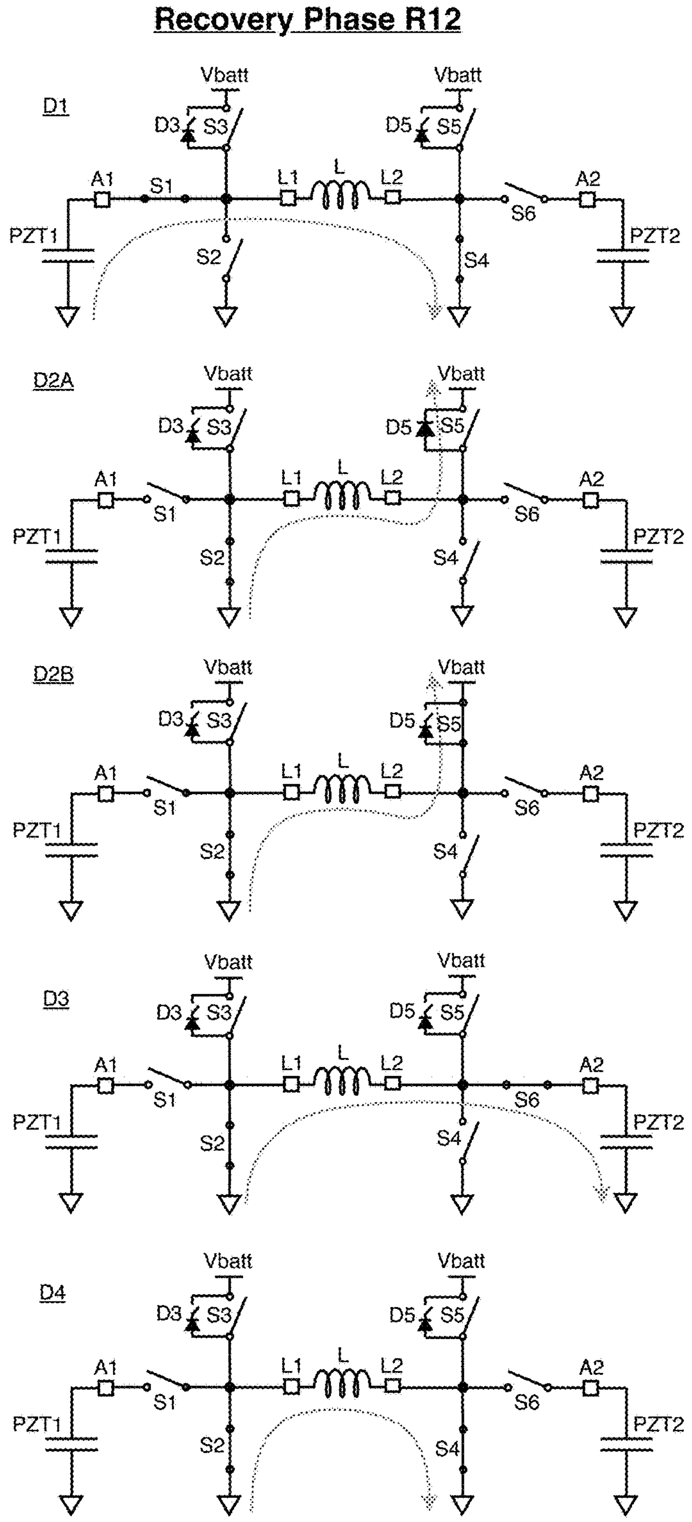
FIG. 14A shows the series of four sub-phases of a first recovery phase in which the driver of FIG. 13 may be operated.
Figure 15A:
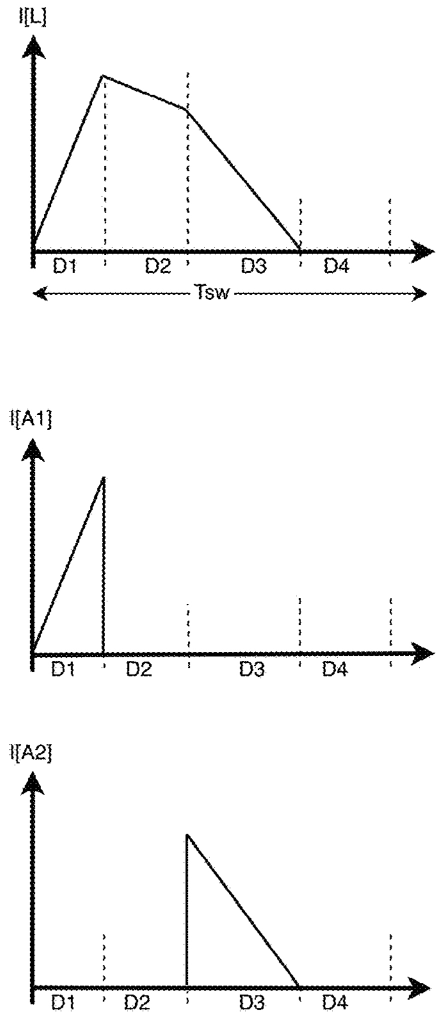
FIG. 15A shows graphs of inductor current and node currents of the driver of FIG. 13 when operating according to the first recovery phase of FIG. 14A.

Next, in phase R12 sub-phase D2, switches S2 and S5 are closed, while the other switches are kept open, having the effect of transferring energy in the inductor L to the battery D3, with the inductor current I[L] falling with a slope of −Vbatt/L as a result as shown in FIG. 15A. To mitigate the effect of a timing mismatch between the opening of switch S4 and the closing of switch S5, the body diode D5 is made active through its related switch to provide for the continuous flow of inductor current I[L]. Specifically, at the instant when switch S4 opens, there is a brief period where there is no direct path for the inductor current I[L] to flow. Nevertheless, the inductor L continues to maintain the direction of inductor current I[L] flow, momentarily elevating the voltage at node L2. If switch S5 is not yet fully closed, this results in the voltage at L2 being higher than Vbatt, forward biasing the body diode D5. This condition allows current conduction through the body diode D5 to Vbatt, thereby providing a temporary path for the inductor current I[L] until switch S5 fully closes, as shown as phase R12 sub-phase “D2A” in FIG. 14A, giving time for switch S5 to close. Once switch S5 fully closes, the path through switch S5 becomes available, and since this path is much lower resistance than the path through the body diode D5, current flow is then through switch S5, which is illustrated as phase R12 sub-phase “D2B” in FIG. 14A.

Next, in phase R12 sub-phase D3, switches S2 and S6 are closed, while the other switches are kept open, having the effect of transferring remaining energy left in the inductor L to the piezoelectric actuator PZT2. Since the inductor current I[L] is flowing from the inductor L to PZT2 at this point, the inductor current I[L] falls with a slope of −VA2/L and the current I[A2] flowing into PZT2 falls with a slope of −VA2/L during sub-phase D3, as shown in FIG. 15A.

In phase R12, sub-phase D4, switches S2 and S4 are closed while the other switches are kept open, with the result being that the current is kept fixed, ideally at zero, ready for the next period in which the current may be reversed or not.

Recovery phase R21 is effectively the inverse of recovery phase R12, and is now described with reference to FIGS. 14B and 15B.

Recovery phase R21 is separated into three sub-phases D1, D2, and D3, followed by sub-phase D4. In phase R21 sub-phase D1, switches S2 and S6 are closed, while the other switches are kept open, having the effect of transferring energy from the piezoelectric actuator PZT2 to the inductor L for storage. This D1 sub-phase can be observed in FIG. 15B, where the current I[L] through the inductor L rises with a slope of VA2/L, and the current I[A2] flowing out of PZT2 rises with a slope of VA2/L.

Figure 15B:
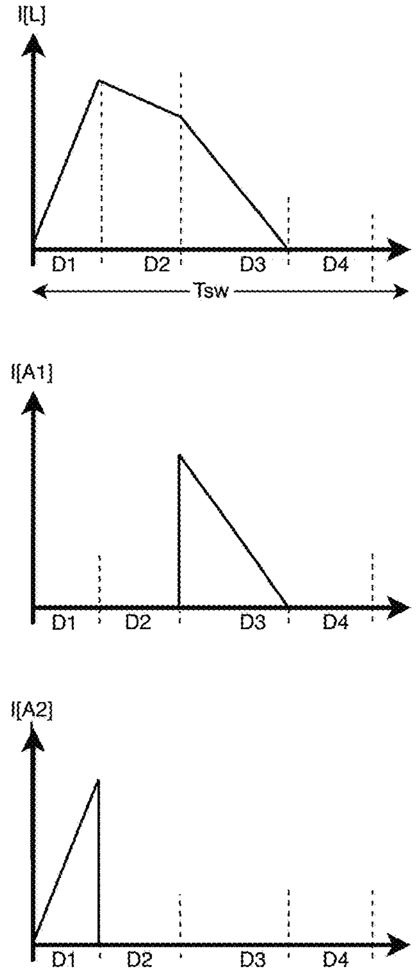
FIG. 15B shows graphs of inductor current and node currents of the driver of FIG. 13 when operating according to the second recovery phase of FIG. 14B.

In phase R21 sub-phase D2, switches S3 and S4 are closed, while the other switches are kept open, having the effect of transferring energy in the inductor L to the battery D3, with the inductor current I[L] falling with a slope of −Vbatt/L as a result as shown in FIG. 15B.

To mitigate the effect of a timing mismatch between the opening of switch S2 and the closing of switch S3, the body diode D3 is made active through its related switch to provide for the continuous flow of inductor current I[L]. Specifically, at the instant when switch S2 is opened, there is a brief period where there is no direct path for the inductor current I[L] to flow. Nevertheless, the inductor L continues to maintain the direction of inductor current I[L] to flow, momentarily elevating the voltage at node L1. If switch S3 is not yet fully closed, this results in the voltage at L1 being higher than Vbatt, forward biasing the body diode D3. This condition allows current conduction through the diode D3 to Vbatt, thereby providing a temporary path for the inductor current I[L] until switch S3 fully closes, as shown as phase R21 sub-phase “D2A” in FIG. 14B, giving time for switch S3 to fully close. Once switch S3 fully closes, the path through switch S3 becomes available, and since this path is much lower resistance than the path through the body diode D3, current flow is then through switch S3, which is illustrated as phase R21 sub-phase “D2B” in FIG. 14B.

In phase R21 sub-phase D3, switches S1 and S4 are closed, while the other switches are kept open, having the effect of transferring remaining energy left in the inductor L to the piezoelectric actuator PZT1. Since the inductor current I[L] is flowing from the inductor L to PZT1 at this point, the inductor current I[L] falls with a slope of −VA1/L and the current I[A1] flowing into PZT1 falls with a slope of −VA1/L during sub-phase D3, as shown in FIG. 15B.

When phase R21 sub-phase D4 is performed, switches S2 and S4 are closed while the other switches are kept open, with the result being that the current is kept fixed, ideally at zero, ready for the next period in which the current may be reversed or not.

Figure 14B:
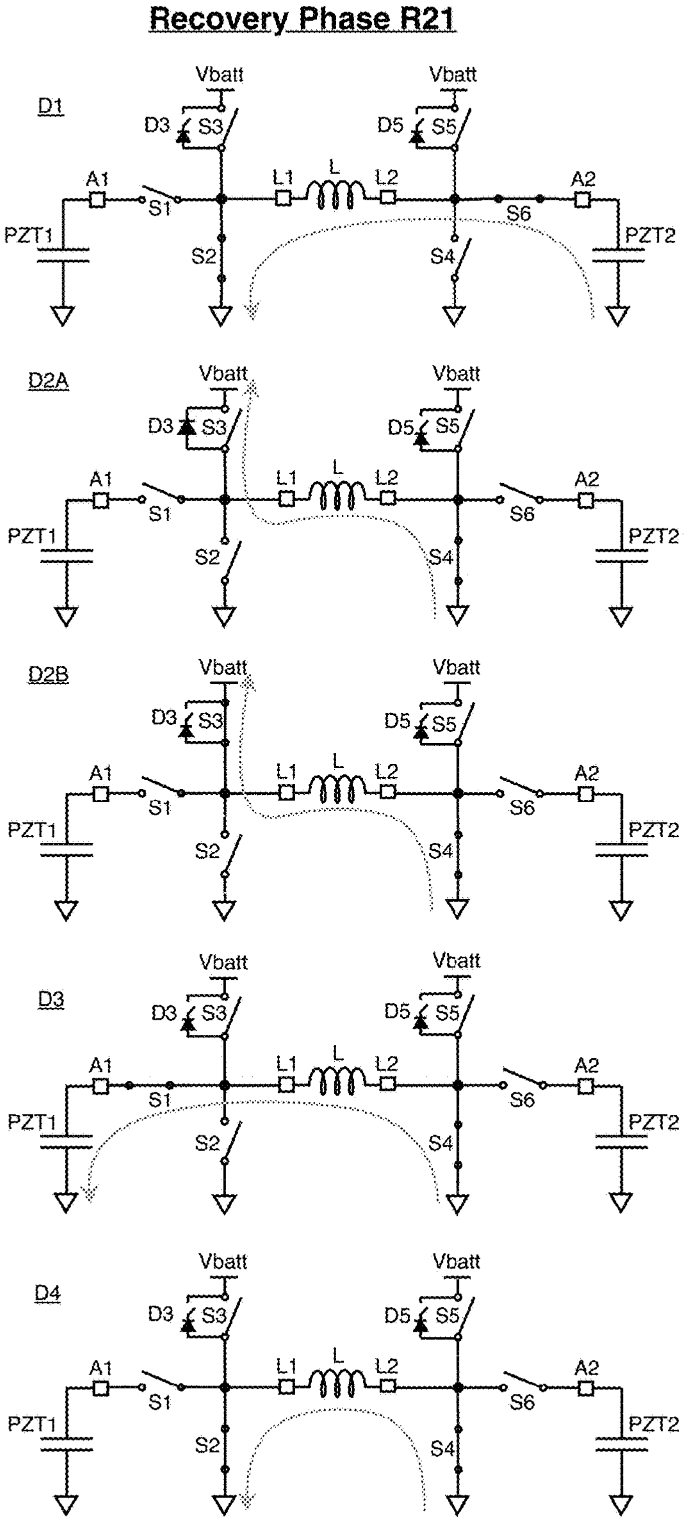
FIG. 14B shows the series of four sub-phases of a second recovery phase in which the driver of FIG. 13 may be operated.

Notice than when using the recovery phases R12 and R21 of FIGS. 14A-14B, each working phase (R12, R21, C12, and C21) can be divided into four sub-phases which follow the same general pattern:

D1, charging of the inductor through the discharging actuator;

D2, involving transfer of energy from or to the battery;

D3, discharging the inductor toward the charging actuator; and

D4, freewheeling.

Operation of the control circuitry 21 to select which charging phase and which recovery phase to operate the driver 10" in, based upon current inputs, is now described. The voltage V[VA1−VA2] is the differential output voltage, and the difference between the differential output voltage V[VA1−VA2] and the differential reference voltage vdm_REF_DATA can be referred to as the "error". The current sign of the differential reference voltage vdm_REF_DATA can be referred to as the "reference sign", and the current sign of the slope of the differential reference voltage vdm_REF_DATA can be referred to as the "reference slope sign".

A single switching period is represented in the graphs of FIGS. 15A-15B. At the end of each switching period, the control circuitry 21 determines which phase (either a charging phase or a recovery phase, and in which direction charge transfer occurs, whether it be from PZT1 to PZT2 or from PZT2 to PZT1) in which to control the driver 10" during the next switching period, based upon the current phase, the error, the reference sign, and the reference slope sign. The relationships between the current phase, error, reference sign, reference slope sign, and the next phase are now described with additional reference to the table of FIG. 7.

If the current phase is the recovery phase R21 and both the error and the reference sign are negative, then the next phase that the control circuitry 21 controls the driver 10" to be in is the charging phase C21.

If the current phase is the recovery phase R21 and both the error and the reference slope sign are both positive, then the next phase that the control circuitry 21 controls the driver 10" to be in is the charging phase C12.

If the current phase is the charging phase C21 and both the error and reference slope sign are positive, then the next phase that the control circuitry 21 controls the driver 10" to be in is the recovery phase R12.

If the current phase is the recovery phase R12 and both the error and reference slope sign are negative, then the next phase that the control circuitry 21 controls the driver 10" to be in is the charging phase C21.

If the current phase is the recovery phase R12 and both the error and reference sign are positive, then the next phase that the control circuitry 21 controls the driver 10" to be in is the recovery phase C12.

If the current phase is the charging phase C12 and both the error and reference slope sign are negative, then the next phase that the control circuitry 21 controls the driver 10" to be in is the recovery phase R21.

The above relationships between the current state, error, reference sign, reference slope sign set the next state as shown in table form in FIG. 7. If none of the conditions in the table of FIG. 7 can be verified, then the next state will be the current state (e.g., the state will not change).

The state change condition from recovery (either R12 or R21) to charge (C21 or C12) can be related to the residual energy after the D1 sub-phase. Specifically, the time duration of sub-phase D2 in the recovery phase is related to the extra energy stored in the inductor L, which in this sub-phase is transferred back to the battery. When the time duration of sub-phase D2 in the recovery phase approaches zero, it means that extra energy is not stored in the inductor L and therefore the next phase is to be a charging phase. Therefore, a state change condition can be added to the one described before, with this being related to state change from recovery to charge (R21 to C12 or R12 to C21) and the condition is the time duration of sub-phase D2 which approaches zero.

The pulse-widths of sub-phases D1 and D2 are determined by the control circuitry 21 based upon the value of the signals it receives as feedback, namely the differential voltage V[VA1−VA2] and common mode voltage V[(VA1+VA2)/2] as well as the continuous time value of the inductor current I[L] to be averaged over one period (i.e., I_AVG[L]). In general though, for whatever phase is to be performed, each feedback signal may be utilized. From a mathematical point of view, the control circuity 21 effectively use the voltages VA1 and VA2, but derives them from the measured differential and common mode voltages. This because it is more advantageous to implement a single double-ended differential readout circuit rather than two single-ended readout circuits.

The pulse-width D3 is instead defined by looking at the instantaneous value of the inductor current I[L] and, more precisely, by looking for the zero crossing.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A driver system for a differential piezoelectric actuator system, the driver system comprising:
- an inductor;
- a driver circuit comprising switches for selectively facilitating transfer of energy between first and second actuators of the differential piezoelectric actuator system and the inductor and between a voltage supply node and the inductor; and
- a control circuitry configured to:
  - determine whether a next phase in which to operate the driver circuit is a first charging phase or a first recovery phase, based upon feedback signals;
  - in the first charging phase:
    - in a first sub-phase of the first charging phase, operate the switches to transfer energy from the first actuator to the inductor;
    - in a second sub-phase of the first charging phase, operate the switches to transfer energy from the voltage supply node to the inductor; and
    - in a third sub-phase of the first charging phase, operate the switches to transfer energy from the inductor to the second actuator; and
  - in the first recovery phase:
    - in a first sub-phase of the first recovery phase, operate the switches to transfer energy from the first actuator to the inductor;
    - in a second sub-phase of the first recovery phase, operate the switches to transfer energy from the inductor to the voltage supply node; and
    - in a third sub-phase of the first recovery phase, operate the switches to transfer energy from the inductor to the second actuator.

2. The driver system of claim 1, wherein the control circuitry is further configured to, in a fourth sub-phase of the first charging phase, operate the switches to maintain an inductor current through the inductor as being fixed, ready for a next phase in which the inductor current may be reversed.

3. The driver system of claim 1, wherein the control circuitry is further configured to, in a fourth sub-phase of the first recovery phase, operate the switches to maintain an inductor current through the inductor as being fixed, ready for a next phase in which the inductor current may be reversed.

4. The driver system of claim 1, wherein a duration of the first sub-phase of the first charging phase is set by the control circuitry based upon the feedback signals from a previous phase, a reference differential voltage, and a reference common mode voltage; wherein a duration of the second sub-phase of the first charging phase is set by the control circuitry based upon the feedback signals from the previous phase, the reference differential voltage, and the reference common mode voltage; wherein a duration of the third sub-phase of the first charging phase is set by the control circuitry based upon a zero crossing of an instantaneous value of an inductor current through the inductor.

5. The driver system of claim 4, wherein the feedback signals comprise a differential between voltages across the first and second actuators, a common mode of the voltages across the first and second actuators, and a continuous time value of the inductor current.

6. The driver system of claim 1, wherein a duration of the first sub-phase of the first recovery phase is set by the control circuitry based upon the feedback signals from a previous phase, a reference differential voltage, and a reference common mode voltage; wherein a duration of the second sub-phase of the first recovery phase is set by the control circuitry based upon the feedback signals from the previous phase, the reference differential voltage, and the reference common mode voltage; wherein a duration of the third sub-phase of the first recovery phase is set by the control circuitry based upon a zero crossing of an instantaneous value of an inductor current through the inductor.

7. The driver system of claim 6, wherein the feedback signals comprise a differential between voltages across the first and second actuators, a common mode of the voltages across the first and second actuators, and a continuous time value of the inductor current.

8. The driver system of claim 1, wherein the driver circuit further comprises additional switches for selectively operating the driver circuit, under control of the control circuitry, as a boost converter to generate a high voltage for driving some of the switches, the high voltage being greater than a voltage at the voltage supply node.

9. The driver system of claim 1, wherein the control circuitry is further configured to whether the next phase in which to operate the driver circuit is a second charging phase or a second recovery phase, based upon the feedback signals;

wherein the control circuitry is further configured to, in the second charging phase:

in a first sub-phase of the second charging phase, operate the switches to transfer energy from the second actuator to the inductor;

in a second sub-phase of the second charging phase, operate the switches to transfer energy from the voltage supply node to the inductor; and in a third sub-phase of the second charging phase, operate the switches to transfer energy from the inductor to the first actuator; and wherein the control circuitry is further configured to, in the second recovery phase:

in a first sub-phase of the second recovery phase, operate the switches to transfer energy from the second actuator to the inductor;

in a second sub-phase of the second recovery phase, operate the switches to transfer energy from the inductor to the voltage supply node; and in a third sub-phase of the second recovery phase, operate the switches to transfer energy from the inductor to the first actuator.

10. The driver system of claim 9, wherein the feedback signals comprise a differential between voltages across the first and second actuators, a common mode of the voltages across the first and second actuators, and a continuous time value of an inductor current through the inductor; and wherein the control circuitry determines whether the next phase in which to operate the driver circuit is the first charging phase, the first recovery phase, the second charging phase, or the second recovery phase based upon the feedback signals by:

a) determining an error value to be a difference between the differential between the voltages across the first and second actuators and a reference differential voltage;

b) determining a reference sign to be a sign of a current value of the reference differential voltage;

c) determining a reference slope sign to be a sign of a current slope of the reference differential voltage;

d) determining a residual energy within the inductor;

e) if a current phase in which the control circuitry is operating the driver circuit is the second recovery phase and the error value and reference sign are both negative, determining the next phase to be the second charging phase;

f) if the current phase in which the control circuitry is operating the driver circuit is the second recovery phase and the error value and reference slope sign are both positive, determining the next phase to be the first charging phase;

g) if the current phase in which the control circuitry is operating the driver circuit is the second charging phase and the error value and reference slope sign are both positive, determining the next phase to be the first recovery phase;

h) if the current phase in which the control circuitry is operating the driver circuit is the first recovery phase and the error value and reference slope sign are both negative, determining the next phase to be the second charging phase;

i) if the current phase in which the control circuitry is operating the driver circuit is the first recovery phase and the error value and reference sign are both positive, determining the next phase to be the first charging phase;

j) if the current phase in which the control circuitry is operating the driver circuit is the first charging phase and the error value and reference slope sign are both negative, determining the next phase to be the second recovery phase;

if the next phase is not determined by e), f), g), h), i), and j), determining the next phase to be a repeat of the current phase.

11. The driver system of claim 10, wherein a duration of the third sub-phase, either in the first recovery phase or the second recovery phase, is indicative of the residual energy present after the second sub-phase of the first recovery phase or the second sub-phase of the second recovery phase, respectively; wherein if the duration of the third sub-phase of the first recovery phase approaches zero, the next phase is to be the first charging phase, and if the duration of the third sub-phase of the second recovery phase approaches zero, the next phase is to be the second charging phase.

12. The driver system of claim 1, wherein a duration of each next phase is predetermined and fixed.

13. The driver system of claim 1, wherein a duration of each next phase is not predetermined and not fixed.

14. A driver system for a differential piezoelectric actuator system, the driver system comprising:

an inductor;

a driver circuit comprising:

a first switch connected between a first actuator of the differential piezoelectric actuator system and a first inductor node connected to a first terminal of the inductor;

a second switch connected between the first inductor node and ground;

a third switch connected between the first inductor node and a voltage supply node;

the third switch including a first body diode configurable to have its anode connected to the first inductor node and its cathode connected to the voltage supply node;

a fourth switch connected between a second inductor node and ground, the second inductor node connected to a second terminal of the inductor;

a fifth switch connected between the voltage supply node and the second inductor node;

the fifth switch including a second body diode configurable to have its anode connected to the second inductor node and its cathode connected to the voltage supply node; and a sixth switch connected between the second inductor node and a second actuator of the differential piezoelectric actuator system; and a control circuitry configured to:

determine whether a next phase in which to operate the driver circuit is a first charging phase, a first recovery phase, a second charging phase, or a second recovery phase based upon feedback signals;

in the first charging phase:

in a first sub-phase of the first charging phase, cause the first and fourth switches to close to transfer energy from the first actuator to the inductor;

in a second sub-phase of the first charging phase, cause the third and fourth switches to close to transfer energy from the voltage supply node to the inductor; and in a third sub-phase of the first charging phase, cause the second and sixth switches to close to transfer energy from the inductor to the second actuator;

in the second charging phase:

in a first sub-phase of the second charging phase, cause the second and sixth switches to close to transfer energy from the second actuator to the inductor;

in a second sub-phase of the second charging phase, cause the second and fifth switches to close to transfer energy from the voltage supply node to the inductor; and in a third sub-phase of the second charging phase, cause the first and fourth switches to close to transfer energy from the inductor to the first actuator;

in the first recovery phase:

in a first sub-phase of the first recovery phase, cause the first and fourth switches to close to transfer energy from the first actuator to the inductor;

in a second sub-phase of the first recovery phase, cause the second and fifth switches to close to transfer energy from the inductor to the voltage supply node; and in a third sub-phase of the first recovery phase, cause the second and sixth switches to close to transfer energy from the inductor to the second actuator;

in the second recovery phase:

in a first sub-phase of the second recovery phase, cause the second and sixth switches to close to transfer energy from the second actuator to the inductor;

in a second sub-phase of the second recovery phase, cause the third and fourth switches to close to transfer energy from the inductor to the voltage supply node; and in a third sub-phase of the second recovery phase, cause the first and fourth switches to close to transfer energy from the inductor to the first actuator.

15. The driver system of claim 14, wherein the control circuitry is further configured to, in a fourth sub-phase of the first charging phase or the second charging phase, close the second and fourth switches to keep an inductor current through the inductor fixed, ideally at zero, ready for the next phase in which the inductor current may be reversed or not.

16. The driver system of claim 14, wherein the control circuitry is further configured to, in a fourth sub-phase of the first recovery phase or the second recovery phase, close the second and fourth switches to maintain an inductor current through the inductor as being fixed, ideally at zero, ready for the next phase in which the inductor current may be reversed or not.

17. The driver system of claim 14, wherein a duration of the first sub-phase of the first charging phase is set by the control circuitry based upon the feedback signals from a previous phase, a reference differential voltage, and a reference common mode voltage; wherein a duration of the second sub-phase of the first charging phase is set by the control circuitry based upon the feedback signals from the previous phase, the reference differential voltage, and the reference common mode voltage; wherein a duration of the third sub-phase of the first charging phase is set by the control circuitry based upon a zero crossing of an instantaneous value of an inductor current through the inductor.

18. The driver system of claim 17, wherein the feedback signals comprise a differential between the voltages across the first and second actuators, and a common mode of voltages across the first and second actuators, and a continuous time value of the inductor current.

19. The driver system of claim 14, wherein a duration of the first sub-phase of the first recovery phase is set by the control circuitry based upon the feedback signals from the previous phase, a reference differential voltage, and a reference common mode voltage; wherein a duration of the second sub-phase of the first recovery phase is set by the control circuitry based upon the feedback signals from a previous phase, the reference differential voltage, and the reference common mode voltage; wherein a duration of the third sub-phase of the first recovery phase is set by the control circuitry based upon a zero crossing of an instantaneous value of an inductor current through the inductor.

20. The driver system of claim 19, wherein the feedback signals comprise a differential between voltages across the first and second actuators, a common mode of the voltages across the first and second actuators, and a continuous time value of the inductor current.

21. The driver system of claim 14, wherein the feedback signals comprise an average inductor current through the inductor and a differential between voltages across the first and second actuators, and a common mode of the voltage across the first and second actuators;

wherein the control circuitry determines whether the next phase in which to operate the driver circuit is a charging phase or a recovery phase based upon residual energy present after a third sub-phase of a current phase in which the driver circuit is being operated; and wherein the control circuitry determines whether the next phase in which to operate the driver circuit is the first charging phase, the first recovery phase, the second charging phase, or the second recovery phase based upon the feedback signals by:

a) determining an error value to be a difference between the differential between the voltages across the first and second actuators and a reference differential voltage;

b) determining a reference sign to be a sign of a current value of the reference differential voltage;

c) determining a reference slope sign to be a sign of a current slope of the reference differential voltage;

d) determining the residual energy within the inductor;

e) if a current phase in which the control circuitry is operating the driver circuit is the second recovery phase and the error value and reference sign are both negative, determining the next phase to be the second charging phase;

f) if the current phase in which the control circuitry is operating the driver circuit is the second recovery phase and the error value and reference slope sign are both positive, determining the next phase to be the first charging phase;

g) if the current phase in which the control circuitry is operating the driver circuit is the second charging phase and the error value and reference slope sign are both positive, determining the next phase to be the first recovery phase;

h) if the current phase in which the control circuitry is operating the driver circuit is the first recovery phase and the error value and reference slope sign are both negative, determining the next phase to be the second charging phase;

i) if the current phase in which the control circuitry is operating the driver circuit is the first recovery phase and the error value and reference sign are both positive, determining the next phase to be the first charging phase; and j) if the current phase in which the control circuitry is operating the driver circuit is the first charging phase and the error value and reference slope sign are both negative, determining the next phase to be the second recovery phase;

if the next phase is not determined by e), f), g), h), i), and j), determining the next phase to be a repeat of the current phase.

22. The driver system of claim 21, wherein a duration of the third sub-phase, either in the first recovery phase or the second recovery phase, is indicative of the residual energy present after the second sub-phase of the first recovery phase or the second sub-phase of the second recovery phase, respectively; wherein if the duration of the third sub-phase of the first recovery phase approaches zero, the next phase is to be the first charging phase, and if the duration of the third sub-phase of the second recovery phase approaches zero, the next phase is to be the second charging phase.

23. The driver system of claim 14, wherein the driver circuit further comprises a seventh switch connected between the first inductor node and a high voltage node and an eighth switch connected between the second inductor node and the high voltage node; and wherein the control circuitry is configured to, after each third sub-phase, operate the driver circuit in boost mode to increase a voltage at the high voltage node to be greater than a voltage at the voltage supply node, so that the boost mode is performed during a same switching period as the first sub-phase, second sub-phase, and third sub-phase.

24. The driver system of claim 23, wherein the control circuitry operates the driver circuit in the boost mode by:

in a first boost sub-phase, close the second and fifth switches to cause transfer of energy from the voltage supply node into the inductor; and in a second boost sub-phase, close the fourth and seventh switches to thereby boost the voltage at the high voltage node.

25. The driver system of claim 23, wherein the control circuitry operates the driver circuit in the boost mode by:

in a first boost sub-phase, close appropriate ones of the switches to cause transfer of energy from the voltage supply node into the inductor; and in a second boost sub-phase, close other appropriate ones of the switches to thereby boost the voltage at the high voltage node.

* * * * *